(12) United States Patent
Fujimoto

(10) Patent No.: US 7,339,234 B2
(45) Date of Patent: Mar. 4, 2008

(54) SEMICONDUCTOR DEVICE AND FABRICATION PROCESS THEREOF, AND APPLICATION THEREOF

(75) Inventor: Keiji Fujimoto, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 74 days.

(21) Appl. No.: 11/367,643

(22) Filed: Mar. 3, 2006

(65) Prior Publication Data

US 2006/0197149 A1   Sep. 7, 2006

(30) Foreign Application Priority Data

Mar. 7, 2005   (JP) .............................. 2005-062427

(51) Int. Cl.
    *H01L 29/76* (2006.01)
(52) U.S. Cl. ...................... 257/336; 257/335; 257/328; 257/344; 257/E29.261
(58) Field of Classification Search ...................... None
    See application file for complete search history.

(56) References Cited

FOREIGN PATENT DOCUMENTS

| JP | 7-302903 | 11/1995 |
|---|---|---|
| JP | 8-107202 | 4/1996 |
| JP | 10-335663 | 12/1998 |
| JP | 2003-86790 | 3/2003 |

*Primary Examiner*—Evan Pert
*Assistant Examiner*—Tan Tran
(74) *Attorney, Agent, or Firm*—Cooper & Dunham, LLP

(57) ABSTRACT

An LDMOS transistor includes a gate insulation film formed on a semiconductor substrate, a gate electrode formed on the gate insulation film, a drain well of a first conductivity type formed in the substrate so as to include a gate region covered with the gate electrode, a channel well of a second conductivity type formed in the drain well in a partially overlapped relationship with the gate region, a source region of the first conductivity type formed in the channel well in an overlapping manner or adjacent with a side surface of the gate electrode, a medium-concentration drain region of the first conductivity type having an intermediate concentration level and formed in the drain well at a side opposing to the source region in a manner partially overlapping with the gate region, the medium-concentration drain region being formed with a separation from the channel well, a drain region of the first conductivity type formed in the medium-concentration drain region with a separation from the gate region, a low concentration well of the second conductivity type formed inside the drain well so as to include at least a part between said channel well and the medium-concentration drain region.

15 Claims, 16 Drawing Sheets

SEMICONDUCTOR DEVICE AND FABRICATION PROCESS THEREOF, AND APPLICATION THEREOF

BACKGROUND OF THE INVENTION

The present invention relates to semiconductor devices, the fabrication process thereof, and application thereof. Particularly, the present invention relates to a semiconductor device having a transistor of LDMOS structure, the fabrication process thereof, and application thereof.

In this specification, an LDMOS transistor (lateral double diffuse insulation gate field transistor) is defined as a field effect transistor having a low impurity concentration layer formed so as to surround the source region with a conductivity type opposite to the conductivity type of the source or drain region. The LDMOS transistor thereby uses a surface part of the low impurity concentration layer right underneath the gate electrode as a channel region. Further, "conventional MOS transistor" used in this specification is defined as a MOS transistor having the structure in which a drain region is formed with an impurity concentration level higher than in a channel region.

In the field of the semiconductor devices that include a circuit such as regulator or DC/DC converter, there is a demand for a semiconductor device of high output current in these days in view of the need of using the semiconductor device in wide variety of applications. An LDMOS transistor is characterized by low ON-resistance and thus draws attention because of its capability of increasing the output current. An LDMOS transistor has a unique feature, originating from its structure, in that miniaturization is possible while maintaining high breakdown voltage and it becomes possible to reduce the chip area with the use of such an LDMOS transistor.

An LDMOS transistor is a field effect transistor in which a low impurity concentration layer (channel well) is formed so as to surround a source region with a conductivity type opposite to the conductivity type of source and drain regions. A channel is formed at a surface of the low impurity concentration layer right underneath the gate electrode.

FIG. 1A shows an example of an n-channel LDMOS transistor.

Referring to FIG. 1A, a polysilicon gate electrode 106 is formed over a silicon substrate 102 of n-type having a high resistivity via a gate oxide film (gate insulation film) 104, wherein there is formed a channel well 108 in the silicon substrate 102 by introducing and activating a p-type impurity element while using an edge of the gate electrode 106 at the side of the source region as a mask. Thereby, a part of the channel well 108 thus formed serves for the channel region. Further, a source region 110 of n-type and a drain region 112 of n-type are formed in the silicon substrate 102 with low resistance by an ion implantation process of an n-type impurity element conducted while using the gate electrode 106 as a mask and subsequent thermal activation. Further, there is provided an interlayer insulation film 114 and electrodes 116 and 118 are formed respectively in connection with the n-type source region 110 and the n-type drain region 112. Reference should be made to Patent Reference 1.

In the case of using an LDMOS transistor for a high voltage transistor, it is generally practiced, in order to relax the electric field caused between the drain electrode and the gate electrode, to increase the thickness of a gate oxide film 104a as shown in FIG. 1B or by interposing a thick field oxide film 104b as shown in FIG. 1C. Reference should be made to Patent Reference 2, for example. Here, it should be noted that the reference numeral 120 represents a drain region of medium concentration level of n-type formed underneath the thick oxide film 104a or 104b with an impurity concentration level higher than the n-type silicon substrate 102 but lower than the n-type drain region 112.

With the structure in which the thickness of the gate oxide film is not increased at the drain edge part as in the case of FIG. 1A, the n-type drain region 112 is located right underneath the gate electrode and the breakdown characteristic is tend to be deteriorated because of the concentration of electric field in such a part.

Thus, in order to improve the breakdown voltage of an LDMOS transistor, there is proposed a method of disposing the high concentration drain region with a separation from the gate electrode.

FIG. 2 is a cross-sectional diagram showing a conventional n-channel LDMOS transistor.

Referring to FIG. 2, there is formed a drain well 21 of n-type in a p-type semiconductor substrate (p-type substrate) 1, wherein there is formed a p-type channel well 23 in the n-type drain well 21, and there is further formed an n-type source region 11s in the p-type channel well 23. Inside the n-type drain well 21, there is formed a drain region lid of n-type with a separation from the p-type channel well 23 with a concentration level higher than the n-type drain well 21. Further, there is formed an n-type gate electrode 11g of polysilicon over and across the n-type drain well 21 for the part between the n-type source region 11s and n-type drain region 11d and further the p-type channel well 23 but with a separation from the n-type drain region 11d. The gate electrode 11g is provided via a gate oxide film 11ox. With this structure, the surface of the p-type channel well 23 right underneath the n-type gate electrode 11g becomes the channel region.

With the n-channel LDMOS of such a structure, the On-resistance is determined as a sum of the channel resistance, the drain resistance and the source resistance. Thus, with the present construction, the source resistance is eliminated by forming the n-type source region 11s in self-alignment with the n-type gate electrode 11g.

However, with the structure of FIG. 2, there appears a high drain resistance associated with the resistance component of the n-type drain well 21, while there is caused a decrease of channel resistance when a high electric field is induced in the channel region with application of the gate voltage. Under such a situation, the drain resistance occupies the majority part of the transistor resistance, and there is caused a problem in that it is not possible to increase the drain current.

Further, there has been a problem with the construction of FIG. 2 in that, because the drain region is easily destroyed when a parasitic bipolar transistor has caused conduction as a result of the high electric field caused in the MOS transistor by the drain voltage. When this occurs, it is not possible to obtain a normal operational waveform.

In order to improve the foregoing problem, there is proposed a method of forming the drain region and the source region in the form of double diffusion structure in the LDMOS transistor as proposed in Patent Reference 1.

Further, there is proposed a method of conducting an impurity injection to the surface part of the well located between the gate electrode and the high-concentration drain region in a self-alignment manner for lowering the resistance thereof and for improving the drain breakdown voltage of LDMOS transistor. Reference should be made to Patent Reference 3. However, the LDMOS transistor disclosed in Patent Reference 3 lacks the feature of self-alignment at the source side, and thus, there arises a problem in that the source resistance is not eliminated completely. Thus, the construction of this prior art reference is not suitable for achieving low ON-resistance.

In view of the foregoing problems of the prior art, the inventor of the present invention has attempted formation of both the source side and the drain side by a self-alignment process. FIG. 3 shows the LDMOS transistor used in this related art.

FIG. 3 is a cross-sectional diagram showing the n-channel MOS transistor of this related art, wherein those parts corresponding to the parts described previously are designated by the same reference numerals and the description thereof will be omitted.

Referring to FIG. 3, the LDMOS transistor of the related art is constructed on a p-type substrate and includes therein an n-type source region 11s, an n-type drain region 11d, an n-type gate oxide 11ox, an n-type gate electrode 11g, and an n-type drain well 21, wherein a p-type channel well 23 is formed inside the n-type drain well 21. Thereby, it should be noted that the n-type source region 11s is formed in a self-aligned process with regard to the n-type gate electrode 11g. Further, an n-type drain region 4 of intermediate concentration level is formed on the surface part of the n-type drain well 21 at the side of the n-type drain region lid with regard to the n0type gate electrode 11g. It should be noted that the drain region 24N of the intermediate concentration level is formed in a self-alignment process with regard to the n-type gate electrode 11g. The drain region 24 of the intermediate concentration level is formed shallower than the n-type drain region 11d.

Further, there is disclosed a construction in which the drain region 24 of the intermediate concentration and the gate electrode 11g are partially overlapped in the structure of FIG. 16 Reference should be made to Patent Reference 4, for example.

REFERENCES

Patent Reference 1
  Japanese Laid-Open Patent Application 7-302903 official gazette Patent Reference 2
  Japanese Patent 3,275,569

Patent Reference 3
  Japanese Laid-Open Patent Application 10-335663 official gazette Patent Reference 4
  Japanese Laid-Open Patent Application 2003-86790 official gazette

SUMMARY OF THE INVENTION

In a high voltage device in which an n-channel LDMOS transistor of low ON-resistance having p-channel LDMOS transistor are integrated on the same p-type substrate, it is possible to secure a breakdown voltage up to about 50V, for example, with regard to the p-channel LDMOS transistor by reducing the concentration level of the deep p-type well corresponding to the drain well.

Similarly, it is possible to improve the breakdown voltage of an n-channel LDMOS transistor by reducing the concentration level of the deep n-type well forming the drain well or reducing the concentration level of the n-type medium concentration drain region and increasing the breakdown voltage of the p-n junction formed at the interface to the p-type channel well.

However, in the case the concentration level of the n-type medium concentration drain region is decreased, there arises a problem that the drain region tends to cause thermal destruction with conduction of the parasitic bipolar transistor. Because of this, attempt has been made to improve the breakdown voltage by reducing the impurity concentration level of the n-type drain well.

Thereby, attempt was made to share the fabrication process steps as much as possible by forming the n-type drain region of the n-channel LDMOS transistor and the n-type isolation well of the p-channel LDMOS transistor simultaneously in the prospect of reducing the number of impurity ion implantation process in the fabrication process of the semiconductor device. However, with such an approach, it was discovered that punch-through is tend to be caused between the p-type drain region and the p-type substrate when the impurity concentration level of the n-type isolation well is reduced in the p-channel LDMOS, while such punch-through invites decrease of the breakdown voltage of the p-channel LDMOS transistor. Thus, it was shown that it is not possible to reduce the concentration level of these n-type regions to the level of $8 \times 10^{15}$ cm$^{-3}$ or less.

FIG. 4 is a diagram showing the relationship between the n-type impurity concentration level of the n-type isolation well provided for device isolation and the drain breakdown voltage. In the drawing, the vertical axis represents the drain breakdown voltage in terms of volt, while the horizontal axis represents the n-type impurity concentration level (cm$^{-3}$). In FIG. 4, the p-type drain well formed in the n-type isolation well has the concentration level of $1 \times 10^{-16}$ cm$^{-3}$.

Thus, the present invention has its object of improving the drain breakdown voltage of the LDMOS transistor without decreasing the impurity concentration level of the first conductivity impurity element in the drain well of the first conductivity type and in the intermediate concentration well of the first conductivity type.

In a first aspect, the present invention provides a semiconductor device comprising an LDMOS transistor, said LDMOS transistor comprising:

a gate insulation film formed over a semiconductor substrate;

a gate electrode formed over said gate insulation film;

a drain well of a first conductivity type formed in said substrate so as to include a gate region covered by said gate electrode;

a channel well of a second conductivity type opposite to said first conductivity type formed in said drain well in partially overlapped relationship with said gate region;

a source region of said first conductivity type formed in said channel well in an overlapping manner or adjacent with a side surface of said gate electrode;

a medium-concentration drain region of said first conductivity type having an intermediate concentration level and formed in said drain well at a side opposing to said source region in a manner partially overlapping with said gate region, said medium-concentration drain region being formed with separation from said channel well;

a drain region of said first conductivity type formed in said medium-concentration drain region with a separation from said gate region;

a low concentration well of said second conductivity type formed inside said drain well so as to include at least a part between said channel well and said medium-concentration drain region.

According to the present invention, in which the low concentration well is formed inside the drain well in the LDMOS transistor so as to include at least the region between the channel well right underneath the gate electrode and the medium-concentration drain region, it becomes possible to improve the drain breakdown characteristics of the LDMOS transistor without reducing the concentration level of the first conductivity type impurity element in the drain well of the first conductivity type and the medium-concentration drain region.

In a preferred embodiment, the medium-concentration drain region may be formed to have an impurity concentration level lower than said channel well. By forming the medium-concentration drain region to have a lower impurity concentration level as compared with the channel well, it becomes possible to avoid the loss of effective channel length even after applying thermal activation processing for forming the medium-concentration drain region and the channel well.

In another preferred embodiment, the semiconductor device may be the one in which the semiconductor substrate comprises a p-type semiconductor substrate and the LDMOS transistor is a p-channel LDMOS transistor, the semiconductor device further includes an n-type isolation well and an n-channel LDMOS transistor on the n-type isolation well, the p-channel LDMOS transistor comprising: a drain well of p-type, a channel well of n-type, a medium-concentration drain region of p-type, a source region of p-type, and a drain region of p-type, wherein the first low concentration well of p-type constituting the n-channel LDMOS transistor is formed simultaneously with the second drain well of p-type constituting said p-channel LDMOS transistor.

Thus, in the case the LDMOS transistor of the present invention is an n-channel transistor and there is further formed a p-channel LDMOS transistor on the same semiconductor substrate separately to the n-channel LDMOS transistor such that the p-channel LDMOS transistor includes the n-type isolation well and such that the n-type isolation well includes the drain well of p-type, the channel well of n-type, the medium-concentration drain region of p-type, the source region of p-type and the drain region of p-type, it becomes possible to form the low-concentration well without increasing the number of fabrication steps, by forming the p-type low-concentration well of the n-channel LDMOS transistor and the p-type drain well of the p-channel LDMOS transistor.

In another embodiment, the semiconductor device may be the one in which the semiconductor substrate comprises a p-type semiconductor substrate and the LDMOS transistor is an n-channel LDMOS transistor, the semiconductor device further includes an n-type isolation well and an n-channel LDMOS transistor formed on the n-type isolation well, the p-channel LDMOS transistor comprising: a drain well of p-type; a channel well of n-type; a medium-concentration drain region of p-type; a source region of p-type; and a drain region of p-type, wherein the first drain well of n-type constituting the n-channel LDMOS transistor is formed simultaneously with the isolation well of n-type constituting the p-channel LDMOS transistor.

Thus, in the case the LDMOS transistor of the present invention is an n-channel transistor and there is further formed a p-channel LDMOS transistor on the same semiconductor substrate separately to the n-channel LDMOS transistor such that the p-channel LDMOS transistor includes the n-type isolation well and such that the drain well of p-type, the channel well of n-type, the medium-concentration drain region of p-type, the source region of p-type, and the drain region of p-type are formed in the n-type isolation well, it becomes possible to reduce the number of fabrication steps, by forming the n-type drain well of the n-channel LDMOS transistor and the n-isolation well of the p-channel LDMOS transistor simultaneously.

Further, the semiconductor device may be the one in which the semiconductor substrate comprises a p-type semiconductor substrate and the LDMOS transistor is an n-channel LDMOS transistor, the semiconductor device further comprising a conventional n-channel MOS transistor comprising a p-type well, wherein the low concentration well of p-type constituting the n-channel LDMOS transistor is formed simultaneously to the p-type well of the conventional n-channel MOS transistor.

By forming, in the case in which the LDMOS transistor of the semiconductor device is an n-channel device and a conventional n-channel MOS transistor is formed separately therefrom on the same semiconductor substrate, the p-type low-concentration well constituting the n-channel LDMOS transistor concurrently with the p-type well constituting the conventional n-channel MOS transistor, it becomes possible to form a p-type low concentration well without increasing the number of the fabrication process steps.

Further, the semiconductor device may be the one in which the semiconductor substrate comprises a p-type semiconductor substrate and the LDMOS transistor is an n-channel LDMOS transistor, the semiconductor device further comprising a conventional p-channel MOS transistor comprising an n-type well, wherein the n-type drain well constituting the n-channel LDMOS transistor is formed simultaneously to the n-type well of the conventional n-channel MOS transistor.

By forming, in the case in which the LDMOS transistor of the semiconductor device is an n-channel device and a conventional p-channel MOS transistor is formed separately therefrom on the same semiconductor substrate, the n-type drain well constituting the n-channel LDMOS transistor concurrently with the n-type well constituting the conventional p-channel MOS transistor, it becomes possible to reduce the number of fabrication process steps of the semiconductor device.

Further, in the present invention, it is possible to reverse the conductivity type with regard to the construction noted above.

Further, in the semiconductor device of the present invention in which an LDMOS transistor and a conventional MOS transistor are integrated, the gate insulation film of the LDMOS transistor may have a thickness smaller than the conventional n-channel MOS transistor.

By reducing the thickness of the gate insulation film of the LDMOS transistor as compared with the conventional MOS transistor, it becomes possible to reduce the ON-resistance of the LD MOS transistor and decrease the chip area.

Further, in the LDMOS transistor of the present invention, the gate insulation film may be formed to have a uniform thickness.

By forming the gate insulation film to have a uniform thickness, it becomes possible to form the source region, the channel well and the medium-concentration drain region with a self-alignment process.

Further, the present invention is applicable to the device in which an edge of the gate electrode close to the drain region is formed on an insulation film having a thickness larger than a thickness of the gate insulation film.

The semiconductor device of the present invention may be applied to an LDMOS transistor used in a power supply unit that includes a feedback circuit maintaining an output voltage constant by comparing the output voltage with a reference voltage.

In another example, the semiconductor device of the present invention may be applied to a DC/DC converter having a charge pump circuit that charges and discharges a capacitor with a switching operation of internal switches, wherein the LDMOS transistor of the present invention is used for at least one of such internal switches.

In another aspect, the present invention provides a fabrication process of a semiconductor device including an LDMOS transistor comprising the steps of:

(A) forming a drain well of a first conductivity type in a semiconductor substrate;

(B) forming a low-concentration well of a second conductivity type by introducing an impurity element of a second conductivity type into the drain well;

(C) forming a gate insulation film on a surface of said low-concentration well and forming a gate electrode on the gate insulation film;

(D) forming a channel well of the second conductivity by introducing and activating an impurity element of the second conductivity type into the low-concentration well at a side of the gate electrode in self-alignment to the gate electrode;

(E) forming a medium-concentration drain region of said first conductivity type by introducing an impurity element of the first conductivity type to a part of said low-concentration well at a side opposite to said channel well with respect to the gate electrode; and (F) forming a drain region of the first conductivity type in said medium-concentration drain region and a source region of the first conductivity type in the channel well by introducing an impurity element of the first conductivity type to the medium-concentration drain region and the channel well.

In a preferred embodiment, a thermal activation processing is conducted in the step (E) after introducing the impurity element for forming the medium-concentration drain region.

Further, the step of activating of step (D) conducted after introducing the impurity element for forming the channel well and the thermal activation processing of the step (E) conducted after introducing the impurity element for forming the medium-concentration drain region are conducted simultaneously.

With this, it is possible to reduce the number of the fabrication steps.

Further, the step (D) of introducing the impurity element for forming said-channel well may be conducted with an amount exceeding an amount of the impurity element introduced in the step (E) for forming the medium-concentration drain region.

Further, the step (A) may include a step of forming a well of the first conductivity, simultaneously to the step of forming said drain well, at a part of the semiconductor substrate different from a region where the LDMOS transistor is formed, for formation of another MOS transistor.

By forming the well of the first conductivity type for formation of another MOS transistor simultaneously to the formation of the drain well, it becomes possible to reduce the number of the fabrication process steps.

Here, "another MOS transistor" includes both a conventional MOS transistor and an LDMOS transistor.

In another preferred embodiment, the well of the another MOS transistor formed in the step (A) may be formed for a second LDMOS transistor, and wherein the step (B) is conducted so as to form a drain well of the second conductivity type in the well of the second LDMOS transistor.

By forming the drain well of the second conductivity type in the well of the second LDMOS transistor simultaneously to the formation of the low-concentration well, it becomes possible to form the low-concentration well without increasing the number of the fabrication process steps.

Further, in a further preferred embodiment, the step (B) may be conducted so as to form a well of the second conductivity type simultaneously with formation of the low-concentration well, in a region of the semiconductor substrate different from a region where the LDMOS transistor is formed for another MOS transistor.

By forming the formation of the low-concentration well concurrently with the step of forming another MOS transistor, it is possible to form the low-concentration well without increasing the number of the fabrication steps.

According to the semiconductor device of the present invention, in which the low concentration well is formed inside the drain well of the LDMOS transistor, it becomes possible to improve the breakdown characteristics without reducing the concentration level of the medium-concentration drain region and drain well.

By forming the medium-concentration drain region to have an impurity concentration level lower than said channel well, it becomes possible to avoid loss of channel effective length even after thermal activation processing is applied for forming the medium-concentration drain region and the channel wafer region.

In the case the LDMOS transistor formed on the p-type semiconductor substrate is an n-channel transistor and there is further formed a p-channel LDMOS transistor on the semiconductor substrate separately to the n-channel LDMOS transistor such that the p-channel LDMOS transistor includes the n-type isolation well and the drain well of p-type, the channel well of n-type, the medium-concentration drain region of p-type, the source region of p-type, and the drain region of p-type are formed in the n-type isolation well, it becomes possible to form the low-concentration well without increasing the number of fabrication steps, by forming the p-type low-concentration well of the n-channel LDMOS transistor and the p-type drain well of the p-channel LDMOS transistor. Because it is not necessary to reduce the impurity concentration level of the mid-concentration drain and the drain well by forming the low-concentration well, there is no need of decreasing the concentration of the n-type isolation well for the p-channel LDMOS transistor, and it becomes possible to suppress occurrence of punch-through between the p-type medium-concentration drain and the p-type semiconductor substrate in the p-channel LDMOS transistor.

In the case the LDMOS transistor of the present invention formed on the semiconductor substrate is an n-channel transistor and there is further formed a p-channel LDMOS transistor on the semiconductor substrate separately to the n-channel LDMOS transistor such that the p-channel LDMOS transistor includes the n-type isolation well and that the drain well of p-type, the channel well of n-type, the medium-concentration drain region of p-type, the source region of p-type, and the drain region of p-type are formed in the n-type isolation well, it becomes possible to reduce the number of fabrication steps, by forming the n-type drain well of the n-channel LDMOS transistor and the n-isolation well of the p-channel LDMOS transistor simultaneously. Because it is not necessary to reduce the impurity concentration level of the mid-concentration drain region and the drain well by forming the low-concentration well, there is no need of decreasing the concentration of the n-type isolation well for the p-channel LDMOS transistor, and it becomes possible to suppress occurrence of punch-through between the p-type medium-concentration drain region and the p-type semiconductor substrate in the p-channel LDMOS transistor.

In the case the LDMOS transistor of the semiconductor device is an n-channel device and a conventional n-channel MOS transistor is formed separately therefrom on the same semiconductor substrate, it becomes possible to form the p-type low-concentration well without increasing the number of fabrication process by forming the p-type low-concentration well constituting the n-channel LDMOS transistor concurrently with the p-type well constituting the conventional n-channel MOS transistor.

In the case in which the LDMOS transistor of the semiconductor device is an n-channel device and a conventional p-channel MOS transistor is formed separately therefrom on the same semiconductor substrate, it becomes possible to reduce the number of fabrication process steps of the semiconductor device by forming the n-type drain well constituting the n-channel LDMOS transistor concurrently with the n-type well constituting the conventional p-channel MOS transistor and the fabrication process of the semiconductor device is simplified.

By reducing, in the case the semiconductor device of the present invention comprises a semiconductor device in which an LDMOS transistor and a conventional MOS transistor are integrated, the thickness of the gate insulation film of the LDMOS transistor as compared with the conventional MOS transistor, it becomes possible to reduce the ON-resistance of the LD MOS transistor and decrease the area of the LDMOS transistor. Thereby, it becomes possible to reduce the chip area.

The semiconductor device of the present invention can be applied to the device in which the LDMOS transistor has a gate insulation film of uniform thickness or to the device in which an edge of the gate electrode of the LDMOS transistor close to the drain region is formed on an insulation film having a thickness larger than a thickness of the gate insulation film.

According to a power supply unit of the present invention, ion which the LDMOS transistor constituting the present invention is used therein, it becomes possible to reduce the size of the MOS transistor used for the output driver because of the small ON-resistance, and it becomes possible to reduce the chip area.

In a DC/DC converter of the present invention that uses the LDMOS transistor of the present invention for at least one of internal switches used therein, it becomes possible to reduce the size of the MOS transistor used for the internal switches because of the low ON-resistance, and it becomes possible to reduce the chip area.

Further, according to the present invention, in which the low-concentration well of the second conductivity type is formed in the drain well by conducting the ion implantation of the impurity element of the second conductivity type, it becomes possible to improve the drain breakdown voltage of the LDMOS transistor without decreasing the impurity concentration level of the medium-concentration drain region and the drain well.

By conducting a thermal activation processing in the step (E) after introducing the impurity element for forming the medium-concentration drain region, the medium-concentration drain region is increased and it becomes possible to increase the amount of the impurity element introduced to the medium-concentration drain region as compared with the case not conducting such thermal annealing process, and it becomes possible to reduce the medium concentration drain region and further the drain resistance while maintaining high breakdown voltage.

By conducting the step of activating of step (D) after introducing the impurity element for forming the channel well and the thermal activation processing of the step (E) after introducing the impurity element for forming the medium-concentration drain region simultaneously, it becomes possible to increase the medium-concentration drain region without adding a thermal annealing process.

By increasing the amount of impurity injection for forming the channel well in the step (D)as compared with the an amount of the impurity element introduced in the step (E), it becomes possible to avoid the loss of channel effective length even when thermal activation process is conducted for forming the mid concentration drain region and the channel well.

By forming the well of the first conductivity type for formation of another MOS transistor simultaneously to the formation of the drain well, it becomes possible to reduce the number of the fabrication process steps.

By forming the drain well of the second conductivity type in the well of the second LDMOS transistor simultaneously to the formation of the low-concentration well, it becomes possible to form the low-concentration well without increasing the number of the fabrication process steps.

By forming the formation of the low-concentration well concurrently with the step of forming another MOS transistor, it is possible to form the low-concentration well without increasing the number of the fabrication steps.

DETAILED DESCRIPTION OF THE INVENTION

With the present specification, a "conventional MOS transistor" may any MOS transistor of conventional type including those having an LDD (lightly doped drain) region of double diffusion structure, those having a DDD (double doped drain) structure, those having an LOCOS structure having a thick oxide film at the gate edge, or the like.

Figure 5:
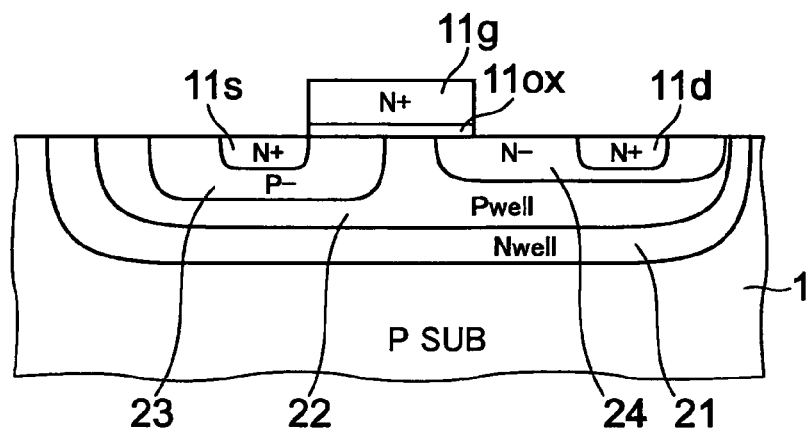
FIG. 5 is a cross-sectional diagram showing an embodiment of the semiconductor device of the present invention.

FIG. 5 is a cross-sectional view showing a semiconductor device according to an embodiment of the present invention, wherein the semiconductor device of FIG. 5 is an embodiment of the LDMOS transistor of the present invention applied to an n-channel LDMOS transistor.

Referring to FIG. 5, a drain well 21 of n-type is formed in a p-type substrate (semiconductor substrate) 1, wherein it can be seen that a p-type low-concentration well 22 is formed in the n-type drain well 21. Further, a p-type channel well 23 is formed in the p-type low-concentration well 22 such that a part of the p-type channel well 23 forms a channel region, and an n-type source region 11s is formed in the p-type channel well 23. Further, there is formed an n-type medium-concentration drain region 24 is formed inside the p-type low-concentration well 22 with a separation from the p-type channel well 23 such that the n-type medium-concentration drain region 24 is introduced with an n-type impurity element such as phosphorus with a concentration level exceeding the concentration level of the p-type low-concentration well 22. Further, an n-type drain region 11d doped with an n-type impurity element such as phosphorus is formed inside the n-type medium-concentration drain region 24 with a concentration level exceeding the concentration level of the n-type medium-concentration drain region 24.

Further, there is formed a gate electrode 11g of n-type polysilicon via a gate oxide film (gate insulation film) 11ox so as to extend over a part of the n-type drain well 21 located between the n-type source region 11s and the n-type drain region 11d with a separation from the n-type drain region 11d, such that the gate electrode 11g further covers a part of the p-type channel well 23 and a part of the n-type medium-concentration drain region 24. Thereby, the separation between the n-type gate electrode 11g and the n-type drain region 11d is set for example to 2.0 µm, while the gate oxide film 11ox may have a thickness of about 30 nm, for example. The surface of the p-type channel well 23 located underneath the n-type gate electrode 11g serves for the channel region. It should be noted that the n-type gate electrode 11g is introduced with phosphorus by an ion implantation process or solid diffusion process with a concentration level of $1.0 \times 10^{21}$ cm$^{-3}$. The n-type source region 11s, the p-type channel well 23 and the n-type medium concentration drain region 24 are formed in self-alignment to the n-type gate electrode 11g.

The p-type channel well 23 is introduced with boron as the p-type impurity element with a concentration level of $1.0 \times 10^{17}$ cm$^{-3}$; The n-type drain well 21 is introduced with phosphorus as the n-type impurity element with the concentration level of $8.0 \times 10^{15}$ cm$^{-3}$. Further, the p-type low-concentration well 22 is introduced with boron as the p-type impurity element with a concentration level of $1.2 \times 10^{16}$ cm$^{-3}$ for the part between the p-type channel well 23 and the n-type medium concentration region 23.

While the present embodiment uses a p-type semiconductor substrate, it is also possible to use an n-type semiconductor substrate. In this case, the conductivity type of various parts noted before is simply reversed.

Figure 6:
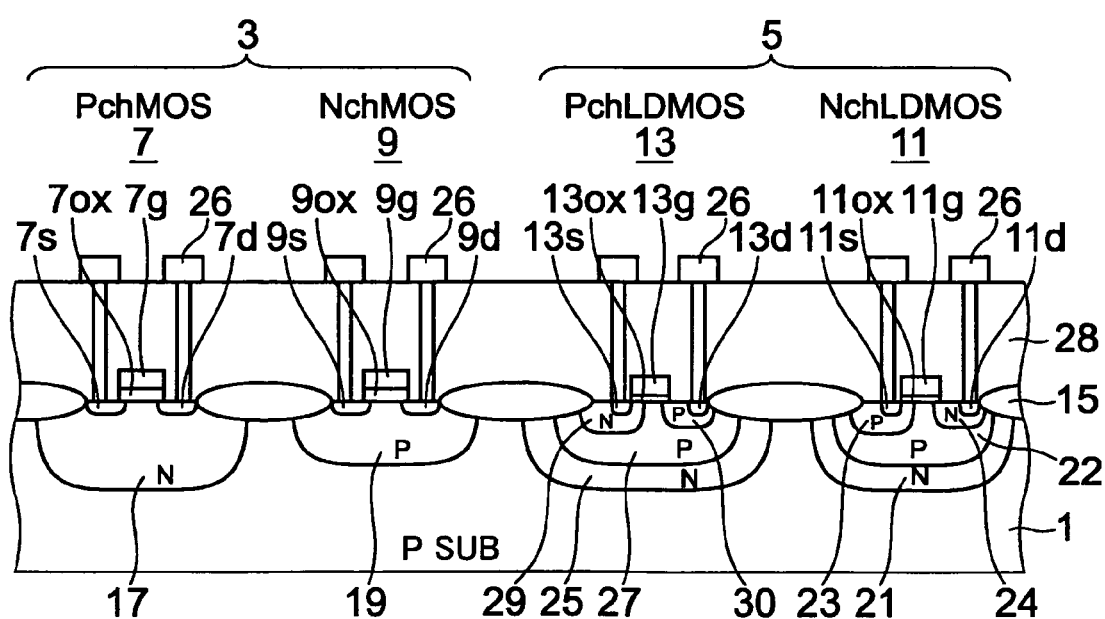
FIG. 6 is a cross-sectional diagram showing another embodiment of the semiconductor device.

FIG. 6 is a cross-sectional diagram showing another embodiment of the semiconductor device of the present invention, wherein the semiconductor device of the present embodiment integrates a conventional p-channel MOS transistor and a conventional n-channel MOS transistor forming a low-voltage CMOS region and a p-channel LDMOS transistor and an n-channel LDMOS transistor forming a high voltage CMOS region on a common semiconductor substrate. Thereby, the semiconductor device of the present embodiment uses the LDMOS transistor of the present invention.

With the present embodiment, a p-type semiconductor substrate (p-substrate) 1 having the substrate resistivity of about 20 Ωcm is used and a low-voltage CMOS region 3 and a high-voltage CMOS region 5 are formed on the semiconductor substrate 1.

Further, a p-channel MOS transistor 7 and an n-channel MOS transistor 9 are formed on the low-voltage CMOS region 3. The p-channel MOS transistor 7 and the n-channel MOS transistor 9 are operated with a supply voltage of 5V, for example.

On the high-voltage CMOS region 5, there are formed an n-channel LDMOS transistor 11 and a p-channel LDMOS transistor 13, wherein the n-channel LDMOS transistor 11 and the p-channel LDMOS transistor 13 may be operated with a supply voltage of 40V, for example.

The p-channel MOS transistor 7 and the n-channel MOS transistor 9, and the n-channel LDMOS transistor 11 and the p-channel LDMOS transistor 13, are separated with each other by a field oxide film 15 formed on the surface of the p-type substrate 1 with a thickness of about 800 nm.

In the part of the low-voltage CMOS region 3 corresponding to the p-channel MOS transistor 7, there is formed an n-type well 17, wherein a p-type source region 7s and a p-type drain region 7d are formed in the n-type well 17 with a mutual separation. Further, there is formed a p-type gate electrode 7g on a part of the n-type well 17 between the p-type source region 7s and the p-type drain region 7d, via a gate oxide film 7ox, wherein a channel region is formed in the surface part of the n-type well 17b right underneath the p-type gate electrode 7g. The gate oxide film 7ox may have a thickness of about 65 nm. The p-type gate electrode 7g is doped with a p-type impurity element such as boron with a concentration level of $1.0 \times 10^{18}$ cm$^{-3}$-$1.0 \times 10^{19}$ cm$^{-3}$, particularly with the dose of $5.0 \times 10^{13}$ cm$^{-2}$. The p-type source region 7s and the p-type drain region 7d are formed in self-alignment with regard to the p-type gate electrode 7g.

The n-type well 17 is doped with an n-type impurity element such as phosphorus, with a concentration of $1.5 \times 10^{16}$ cm$^{-3}$ for the channel region. The p-type source region 7s and the p-type drain region 7d are introduced with boron as the p-type impurity element, with a boron concentration level of $5.0 \times 10^{19}$ cm$^{-3}$. In the p-channel MOS transistor 7, the p-type source region 7s and the p-type drain region 7d are formed with higher impurity concentration level as compared with the channel region.

In the device region corresponding to the n-channel MOS transistor 9, there is formed a p-type well 19 in the p-type substrate 1, wherein an n-type source region 9s and an n-type drain region 9d are formed in the p-type well 19 with a mutual separation. Further, there is formed an n-type gate electrode 9g on a part of the p-type well 19 between the n-type source region 9s and the n-type drain region 9d, via a gate oxide film 9ox, wherein a channel region is formed in the surface part of the p-type well 19 right underneath the p-type gate electrode 9g. The gate oxide film 9ox may have a thickness of about 65 nm. The n-type gate electrode 9g is doped with an n-type impurity element such as phosphorus with a concentration level of $1.0 \times 10^{21}$ cm$^{-3}$, for example by an ion implantation process or solid phase diffusion process. The n-type source region 9s and the n-type drain region 9d are formed in self-alignment with regard to the n-type gate electrode 9g.

The p-type well 19 is doped with a p-type impurity element such as boron, with a concentration of $1.5 \times 10^{16}$ cm$^{-3}$ for the channel region. The n-type source region 9s and the n-type drain region 9d are introduced with phosphorus as the n-type impurity element, with a phosphorus concentration level of $1.0 \times 10^{20}$ cm$^{-3}$ for example. In the n-channel MOS transistor 9, the n-type source region 9s and the n-type drain region 9d are formed with higher impurity concentration level as compared with the channel region.

Figure 1A:
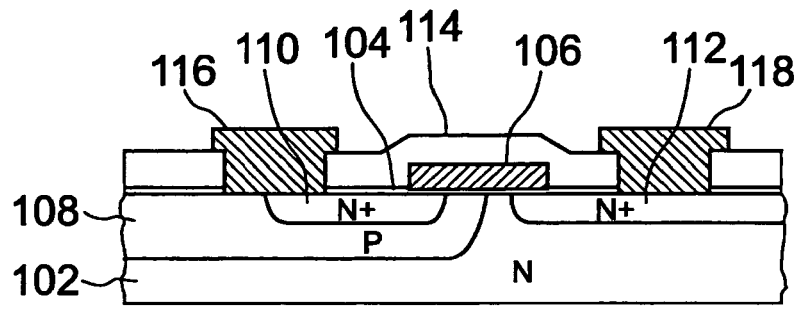
FIGS. 1A-1C are cross-sectional diagrams showing conventional LDMOS transistors.
Figure 1B:
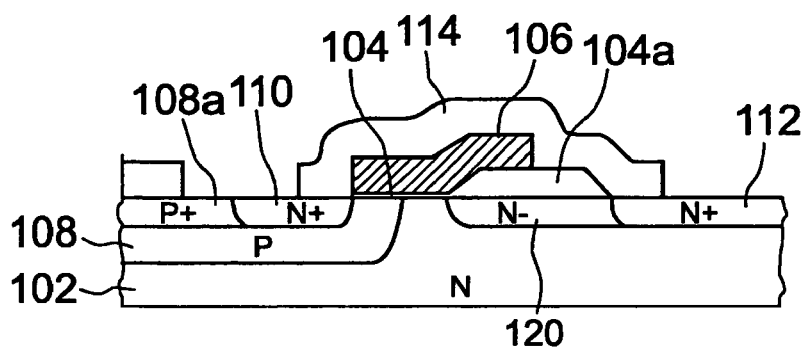
Figure 1C:
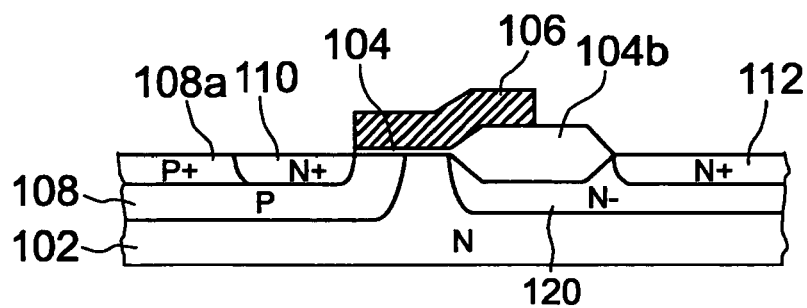

In the region of the n-channel LDMOS transistor 11 of the high-voltage CMOS region 5, there is formed an n-channel LDMOS of the structure identical to that of FIG. 1. Because the structure of the n-channel LDMOS transistor 11 is identical with the structure of FIG. 1, the description thereof will be omitted.

In the region of the p-channel LDMOS transistor 13, there is formed an n-type isolation well 25 for isolating the p-channel LDMOS transistor 13 from the p-type substrate 1.

In the n-type isolation well 25, there is formed a p-type drain well 27, wherein an n-type channel region 29 is formed in the p-type drain well 27. A part of the n-type channel well 29 constitutes a channel region. Further, there is a p-type source region 13g in the n-type channel well 29. In the p-type well, there are formed a medium concentration drain region 30 is formed by introducing boron, for example, with separation from the n-type channel well 29 and with a concentration level higher than that of the p-type drain well 27. Further, a p-type drain region 13d doped with a p-type impurity element such as boron is formed in the p-type medium concentration drain region 20 with a concentration level higher than in the p-type medium concentration drain region 30.

Further, a p-type gate electrode 13g of polysilicon is formed over a part of the p-type drain well 27 between the p-type source region 13s and the p-type drain region 13d via a gate oxide film 13ox so as to cover a part of the n-type channel well 29 and a part of the p-type medium drain region 30 but with separation from the drain region 13d. The separation between the p-type gate electrode 13g and the p-type drain region 13d is set for example to 1.5 μm. The gate oxide film 13ox is formed with a thickness of about 30 nm. Thereby, the part of the n-type channel well 29 underneath the p-type gate electrode 13g functions as the channel region. The p-type gate electrode 13g is introduced with a p-type impurity element such as boron with the concentration of $1.0 \times 10^{18}$-$1.0 \times 10^{19}$ cm$^{-3}$, particularly with the dose of $5.0 \times 10^{13}$ cm$^{-2}$ with the present example. It should be noted that the p-type source region 13s, the n-type channel well 29 and the p-type medium concentration drain region 30 are formed in self-alignment to the p-type gate electrode 13g.

The n-type channel well 29 is introduced with phosphorus as the n-type impurity element, and the channel region contains phosphorus with the concentration level of $1.0 \times 10^{17}$ cm$^{-3}$. Further, the p-type drain well 27 is introduced with boron, wherein the p-type drain well 27 contains boron with the concentration level of $1.2 \times 10^{16}$ cm$^{-3}$. In the p-channel LDMOS transistor 13, it should be noted that the drain region has a lower concentration level than in the channel region.

Further, there is formed an interlayer CVD film 28 over the entire surface of the p-type substrate 1 by a CVD (chemical vapor deposition) process. The interlayer insulation film 28 is formed with a metal interconnection 26 of aluminum, for example. Thereby, the metal interconnection 26 is connected electrically to the p-type source regions 7s and 13s, n-type source regions 9s and 11s, p-type drain regions 7d and 13d and n-type drain regions 9d and 11d via respective contact holes.

With this embodiment, the gate oxide films 7ox and 9ox have a thickness of about 65 nm in the p-channel MOS transistor 7 and the n-channel MOS transistor 9 wherein this film thickness is larger than the film thickness of the gate oxide film 11ox or 13ox of the n-channel LDMOS transistor 11 or the p-channel LDMOS transistor 13 of about 30 nm. It should be noted that the n-type well 17 of the p-channel MOS transistor 7, the n-type drain well 21 of the n-channel LDMOS transistor 11 and the n-type isolation well 25 of the p-channel LDMOS transistor 13 are formed simultaneously. Further, the p-type well 19 of the n-channel MOS transistor 9, the p-type drain well 27 of the p-channel LDMOS transistor 13 and the p-type low-concentration region 22 of the n-channel LDMOS transistor 11 are formed simultaneously. Because the gate oxide films 7ox and 9ox are formed with a smaller thickness as compared with the gate oxide films 7ox and 9ox in the p-channel MOS transistor 7 and the n-channel MOS transistor 9, it is possible to use the n-type well 17 formed simultaneously with the n-type drain well 21 and the n-type isolation well 25. Further, it becomes possible to user the p-type well 19 formed simultaneously to the p-type drain well 27 and the p-type low-concentration region 22.

With regard to the n-channel LDMOS transistor 11 and the p-channel LDMOS transistor 13, the medium concentration drain regions 24 and 30 are formed respectively adjacent to the n-type gate electrode 11g and the p-type gate electrode 13g in self-alignment, and thus, it is possible to reduce the drain resistance and stabilize the transistor characteristics. Further, because the n-type source region 11s and the p-type source region 13s are formed respectively in self-alignment with regard to the n-type gate electrode 11g and the p-type gate electrode 13g, it is possible to reduce the source resistance and stabilize the transistor characteristics.

Further, because the p-type low-concentration well is formed by conducting the impurity ion implantation process for forming the p-type well and the p-type drain well also in the n-type drain region 21, there is no increase in the number of fabrication steps, and it becomes possible to increase the breakdown voltage of the n-channel LDMOS transistor without increasing the number of the fabrication steps.

While the present embodiment describes the semiconductor device that includes the p-channel MOS transistor 7, the n-channel MOS transistor 9, the n-channel LDMOS transistor 11 and the p-channel LDMOS transistor 13 on the same p-type substrate 1, the present invention is by no means limited to such a specific construction but may be applied to any semiconductor device that has an LDMOS transistor.

Next, the fabrication process of the semiconductor device of the present embodiment will be described with reference to FIGS. 7A-7L.

Figure 7A:
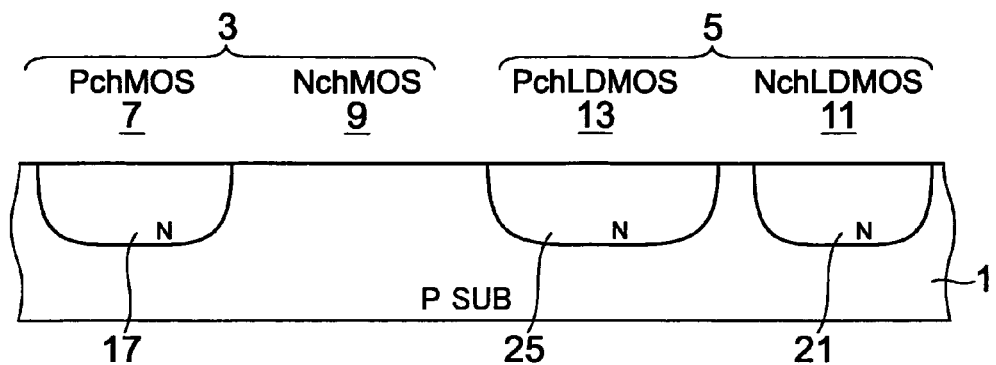
FIGS. 7A-7L are cross-sectional diagrams showing the process steps for fabricating the semiconductor device of FIG. 6.

(1) Referring to FIG. 7A, a resist pattern is formed on the p-type substrate 1 such that the resist pattern has resist openings in correspondence to the device region of the p-channel MOS transistor 7 in the low-voltage CMOS region 3 and the device regions of the n-channel LDMOS transistor 11 and the p-channel LDMOS transistor 13 in the high-voltage CMOS region 5, and ion implantation of phosphorus is conducted into the p-type silicon substrate 1 under the acceleration energy of 150 keV with the dose of about $4.2 \times 10^{12}$ cm$^{-2}$ while using the resist pattern as a mask. Further, after removing the resist pattern, thermal activation is conducted at 1180° C. for 24 hours. With this, the n-type well 17, the n-type isolation well 25 and the n-type drain well 21 are formed simultaneously.

Figure 7B:
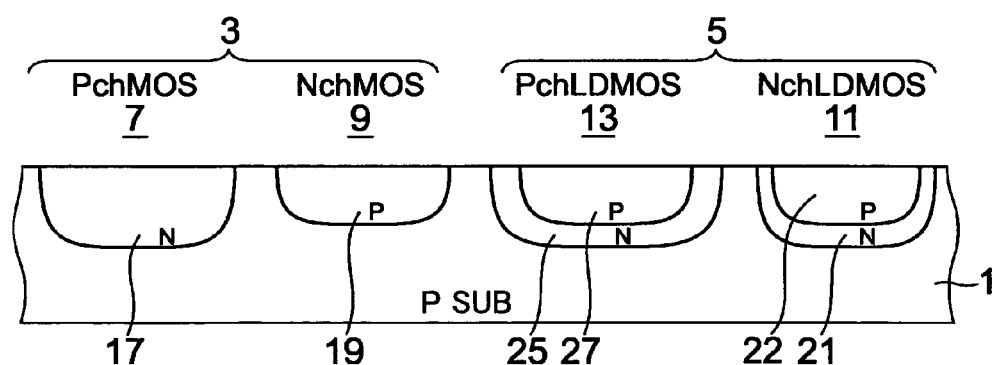

(2) Next, in the step of FIG. 7B, a resist pattern is formed on the p-type substrate 1 such that the resist pattern has resist openings in correspondence to the device region of the n-channel MOS transistor 9 in the low-voltage CMOS region 3 and the device regions of the p-channel LDMOS transistor 13 in the n-type isolation well 25 and the n-channel LDMOS transistor 11 in n-type drain well 21, and ion implantation of boron is conducted into the p-type silicon substrate 1 under the acceleration energy of 50 keV with the dose of about $3.0 \times 10^{12}$ cm$^{-2}$ while using the resist pattern as a mask. Further, after removing the resist pattern, thermal activation is conducted at 1150° C. for 8 hours. With this, the p-type well 19, the p-type drain well 27 and the p-type low-concentration well 22 are formed simultaneously, respectively in the device region of the n-channel MOS transistor 9, the n-type isolation well 25 and in the n-type drain well 21. Thereby, the p-type well 19, the p-type well 27 and p-type well 22 contains the same p-type impurity element with the same concentration level.

Figure 7C:
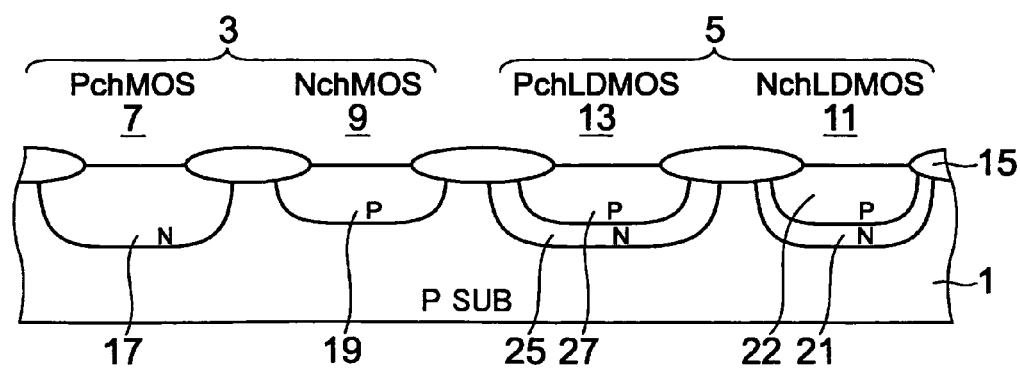

(3) Next, in the step of FIG. 7C, a field oxide film 15 is formed on the surface of the p-type substrate 1 by a LOCOS oxidation process with the thickness of 800 nm, such that the regions of the transistors 7, 9, 11 and 13 are defined. In this step, it is also possible to form an impurity region under the field oxide films 15 for the purpose of channel stopper.

Figure 7D:
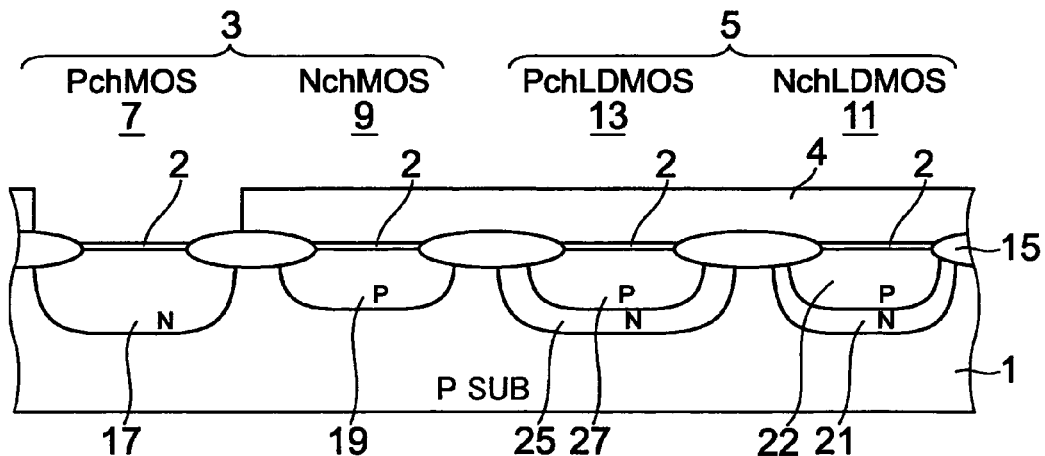

(4) Next, in the step of FIG. 7D, a pre-gate oxide film 2 is formed over the surfaces of the n-type well 17, the p-type well 19, the n-type drain well 21 and the p-type drain well 17 with the thickness of 40 nm. Further, a resist pattern 4 is formed thereon such that the resist pattern 4 has a resist opening in correspondence to the device region of the p-channel MOS transistor 7, and channel doping is conducted into the n-type well 17 for the purpose of threshold control while using the resist pattern 4 as a mask.

Figure 7E:
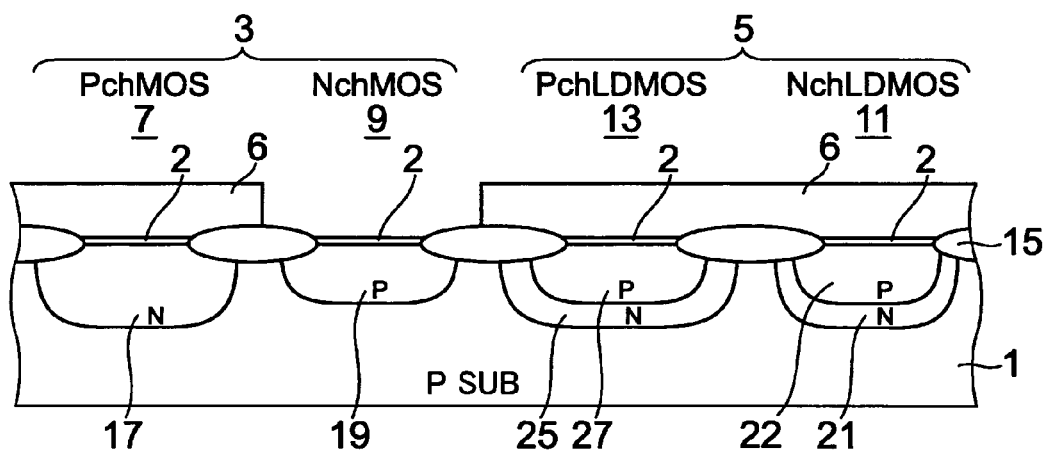

(5) Next, in the step of FIG. 7E, the resist pattern 4 is removed and a resist pattern 6 is formed so as to have an opening in correspondence to the device region of the n-channel MOS transistor 9. Further, while using the resist pattern 6 as a mask, channel doping is conducted to the p-type well 19 for the purpose of threshold control.

Figure 7F:
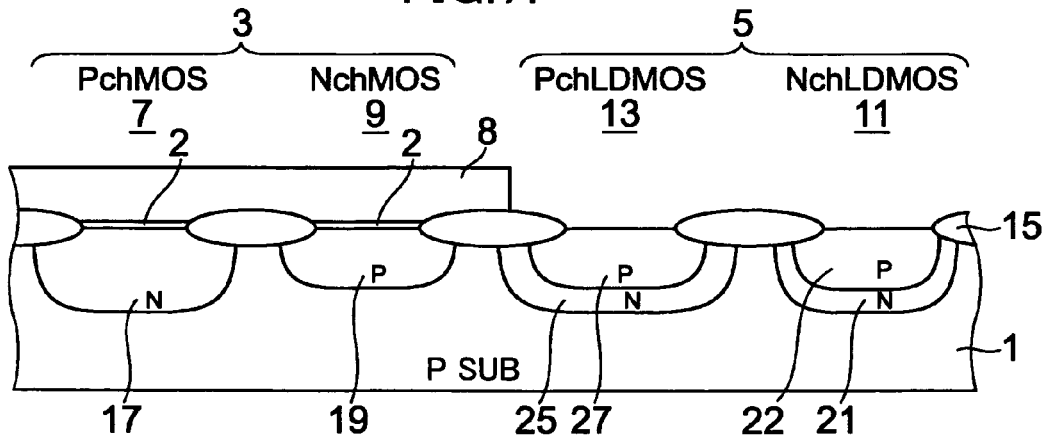

(6) Next, in the step of FIG. 7F, the resist pattern 6 is removed, and a resist pattern 8 is formed such that the resist pattern 8 has openings in correspondence to the device regions of the n-channel LDMOS transistor 11 and the p-channel LDMOS transistor 13. Further, the pre-gate oxide films 2 on the surface of the n-type drain well 21 and the p-type drain well 27 are removed by using a hydrofluoric acid.

Figure 7G:
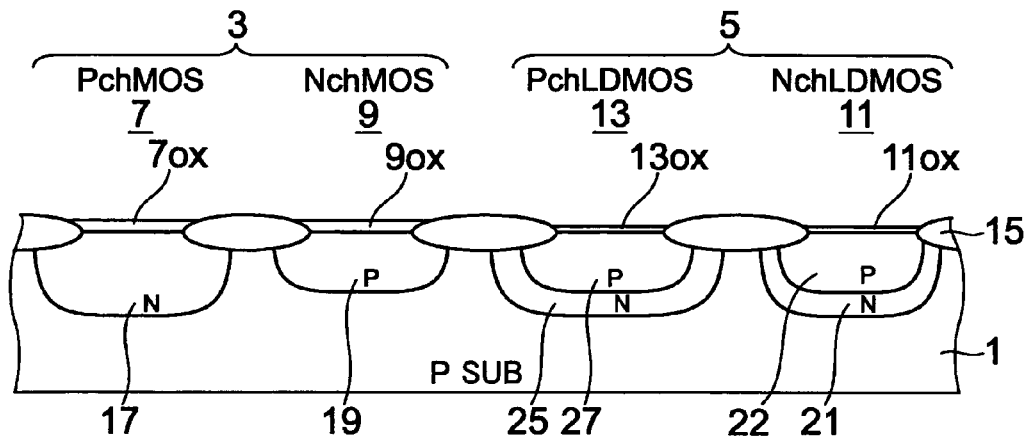

(7) Next, in the step of FIG. 7G, the resist pattern 8 is removed and a thermal oxidation processing is conducted. With this, a gate oxide film 11ox and a gate oxide film 13ox are formed respectively on the surface of the n-type drain well 21 and the p-type drain well 27 with a thickness of about 30 nm. With this thermal processing, it should be noted that the surface of the n-type well 17 and the surface of the p-type well 9 are also oxidized and there are formed gate oxide films 7ox and 9ox respectively on the surfaces of the n-type well 17 and the p-type well 19 with a thickness of 65 nm. In the case it is desired to form the gate oxide films 7ox, 9ox, 11ox and 13ox all with the same film thickness, the pre-gate oxide film 2 is removed in the step (6) from all of the regions and newly form the respective gate oxide films with the thickness of 60-80 nm, for example, by conducting a thermal oxidation processing.

Figure 7H:
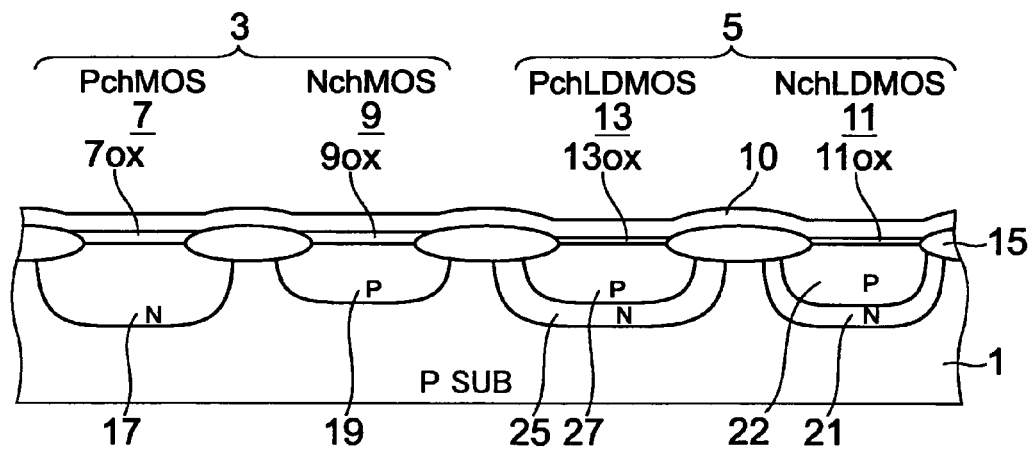

(8) Next, in the step of FIG. 7H, a polysilicon film 10 is formed on the entire surface of the p-type substrate 1 by a CVD process with a thickness of 500 nm. Further, a silicon oxide not illustrated is formed on the surface of the polysilicon film 10 with a thickness of 25 nm by a thermal oxidation processing conducted at a process temperature of 850° C.

Figure 7I:
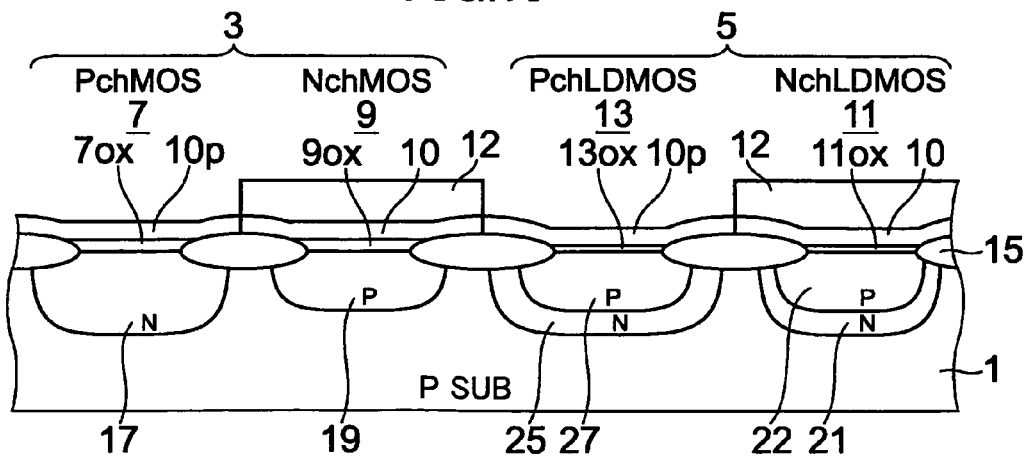

(9) Next, in the step of FIG. 7I, a resist pattern 12 is formed on the polysilicon film 10 such that the resist pattern 12 has an opening in correspondence to the device region of the p-channel MOS transistor 7 and the device region of the p-channel LDMOS transistor 13, and a p-type polysilicon film 10p is formed by introducing boron into the polysilicon film under the acceleration voltage of 15 keV with the dose of about $5.0 \times 10^{13}$ cm$^{-2}$ while using the resist pattern 12 as a mask.

Figure 7J:
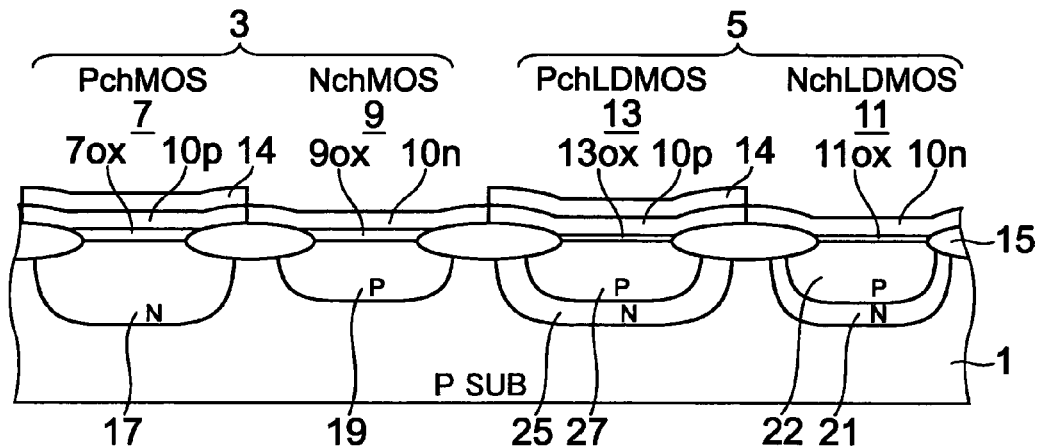

(10) Next, in the step of FIG. 7J, the resist pattern 12 is removed and a silicon oxide film 14 is formed on the entire surface of the semiconductor substrate 1 by a CVD process with the thickness of 200 nm. Further, photolithographic process is conducted and an opening is formed in the silicon oxide film 14 in correspondence to the device region of the n-channel MOS transistor 9 and the device region of the n-channel LDMOS transistor 11. Further, phosphorus is deposited on the entire surface of the p-type substrate 1 and an n-type polysilicon film 10n is formed after conducting a thermal annealing process at 900° C. for 30 minutes. It should be noted that the formation of the n-type polysilicon film 10n may be conducted by an ion implantation process.

Figure 7K:
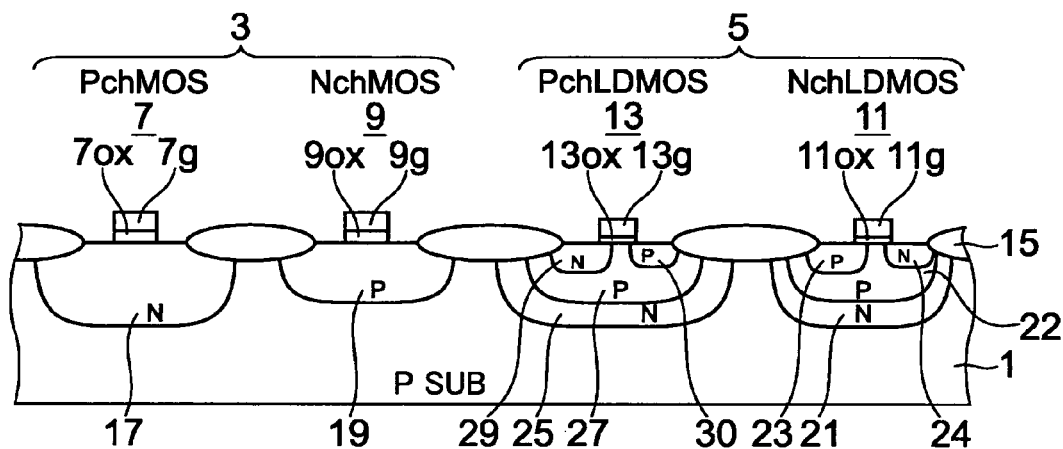

(11) Next, in the step of FIG. 7K, the silicon oxide film 14 is removed and the polysilicon film 10n of n-type and the polysilicon film 10p of p-type thus formed are subjected to a patterning process. With this, the p-type gate electrode 7g of p-type polysilicon is formed on the gate oxide film 7ox in the device region of the p-channel MOS transistor 7, the n-type gate electrode 9g is formed on the gate oxide film 9ox in the device region of the n-channel LDMOS transistor 9, the n-type gate electrode 11g of n-type polysilicon is formed on the gate oxide film 11ox in the device region of the n-channel LDMOS transistor 11, and the p-type gate electrode 13g of p-type polysilicon is formed on the gate oxide film 13ox in the device region of the p-channel LDMOS transistor 13, wherein the gate electrodes 7g, 9g, 11g and 13g are formed simultaneously.

Further, a resist pattern is formed such that the resist pattern has an opening in correspondence to the region where the n-type channel well 29 of the p-channel LDMOS transistor 13 is to be formed including the gate electrode 13g, and ion implantation of phosphorus is conducted under the acceleration energy of 100 keV with the dose of about $3.3 \times 10^{13}$ cm$^{-2}$ while using the resist pattern and the p-type gate electrode 13g as a mask, and with this, the n-type channel well 29 is formed adjacent to the p-type gate electrode 13g.

Further, a resist pattern having an opening in correspondence to the region where the p-type channel well 23 of the n-channel LDMOS transistor 11 is to be formed including the n-type gate electrode 11g, and ion implantation of boron is conducted under the acceleration voltage of 30 keV with the dose of about $3.3 \times 10^{13}$ cm$^{-2}$ while using the resist pattern and the n-type gate electrode 11g as a mask. With this, the p-type channel well 23 is formed adjacent to the n-type gate electrode 11g.

Further, a resist pattern is formed such that the resist pattern has an opening in correspondence to the region where the p-type medium concentration drain region 30 of the p-channel LDMOS transistor 33 is to be formed including the p-type gate electrode 13g, and the p-type medium concentration drain region 30 is formed adjacent to the p-type gate electrode 13g by introducing boron into the p-type drain well 27 under the acceleration energy of 30 keV with the dose of about $4.0 \times 10^{12}$ cm$^{-2}$ while using the resist pattern and the p-type gate electrode 13g as a mask.

Further, a resist pattern is formed such that the resist pattern has an opening in correspondence to the region where the n-type medium concentration drain region 24 of the n-channel LDMOS transistor 11 is to be formed including the n-type gate electrode 11g, and the n-type medium concentration drain region 24 is formed adjacent to the n-type gate electrode 11g by introducing phosphorus into the n-type drain well 21 under the acceleration energy of 100 keV with the dose of about $3.0 \times 10^{12}$ cm$^{-2}$ while using the resist pattern and the n-type gate electrode 11g as a mask.

Thereafter, thermal activation processing is conducted at the process temperature of 1100° C. for the duration of 140 minutes, and with this, the p-type channel well 23, the n-type medium concentration drain region 24, the n-type channel well 29 and the p-type medium concentration region 30 are formed as a result of the diffusion of the respective impurity elements.

Figure 7L:
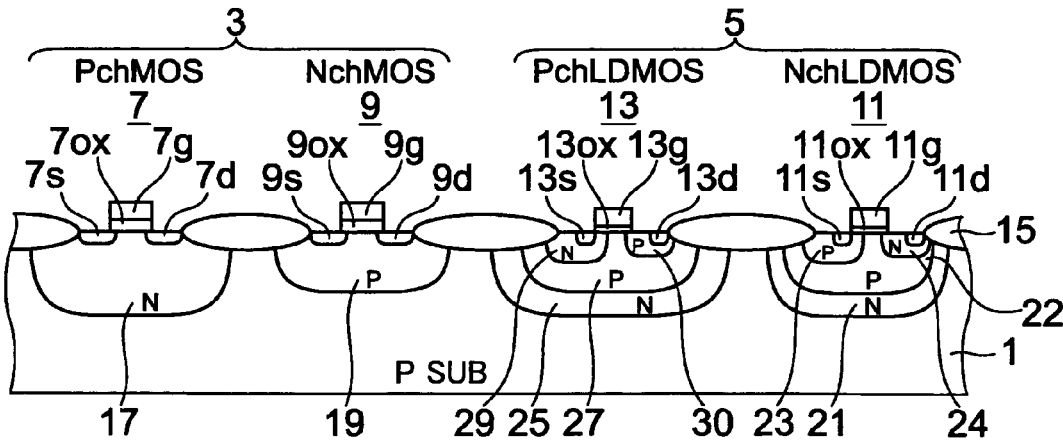

(12) Next, in the step of FIG. 7L, a resist pattern is formed over the p-type substrate 1 such that the resist pattern has openings respectively in correspondence to the n-type well 17 in the device region of the p-channel MOS transistor 7, the region of the n-type channel well 29 of the device region of the p-channel LDMOS transistor 13 adjacent to the p-type gate electrode 13g, and further in the p-type medium concentration drain region 30. Thereby, the resist pattern is formed such that there exists a resist pattern having a width of 1.5 μm on the p-type medium concentration drain region 30 adjacent to the p-type gate electrode 13g. Further, ion implantation of boron is conducted to the n-type well 17, the n-type channel well 29 and further the p-type medium drain region 30 under the acceleration energy of 30 keV with the dose of about $1.5 \times 10^{15}$ cm$^{-2}$ while using the resist pattern as a mask.

After removing the resist pattern, a resist pattern is formed over the p-type substrate 1 such that the resist pattern includes openings in correspondence to the p-type well 19 in the device region of the n-channel MOS transistor 9, the region of the p-type well 23 in the device region of the n-channel LDMOS transistor 11 adjacent to the n-type gate electrode 11g, and the n-type medium concentration drain region 24. Thereby, the resist pattern is formed such that there exists a resist patter of the width of 2.0 μm over the n-type medium concentration drain region 24 adjacent to the n-type gate electrode 11g. Further, while using the resist pattern as a mask, ion implantation of phosphorous or arsenic is conducted simultaneously to the p-type well 19, the p-type channel well 23 and the n-type medium concentration drain region 24 under the acceleration energy of 50 keV with the dose of $6.0 \times 10^{15}$ cm$^{-2}$.

Further, after removal of the resist pattern, a thermal activation processing is conducted, and with this, the p-type source region 7s and the p-type drain region 7d are formed in the n-type well 17 in the device region of the p-channel MOS transistor 7, the n-type source region 9s and the n-type drain region 9d are formed in the p-type well 19 in the device region of the p-channel MOS transistor 9. Further, in the device region of the n-channel LDMOS transistor 11, the n-type source region 11s is formed in the p-type channel well 23 and the n-type drain region 11d is formed in the n-type medium concentration drain region 24. Further, in the device region of the p-channel LDMOS transistor 13, the p-type source region 13s is formed in the n-type channel well 29 and the p-type drain region 13d is formed in the p-type medium concentration drain region 30. Thereby, it should be noted that, in order to relax the gate electric field, the n-type drain region 11d of the n-channel LDMOS transistor 11 is formed with a separation of about 2.0 μm from the n-type gate electrode 11g. Similarly, the p-type drain region 13d of the p-channel LDMOS transistor 13 is formed with a separation of about 1.5 μm from the p-type gate electrode 13g.

Figure 2:
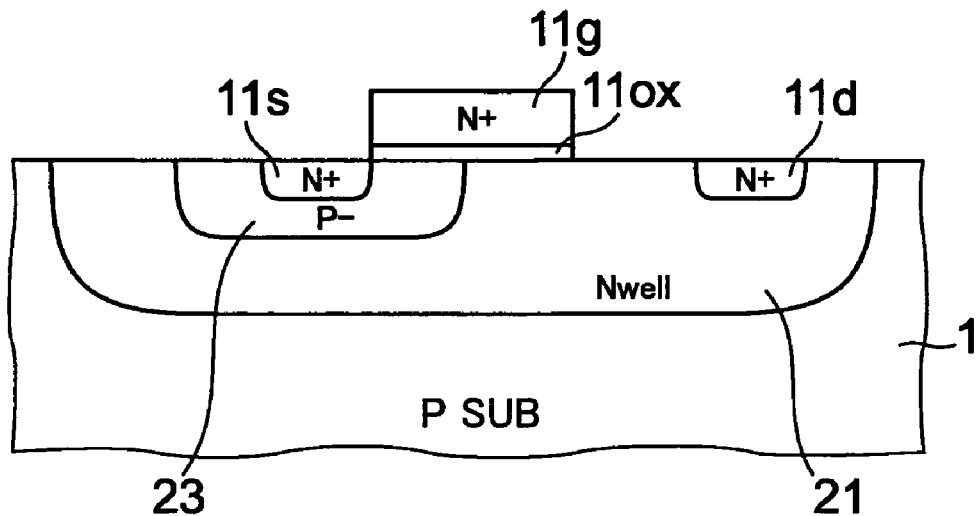
FIG. 2 is a cross-sectional diagram showing another conventional LDMOS transistor.
Figure 3:
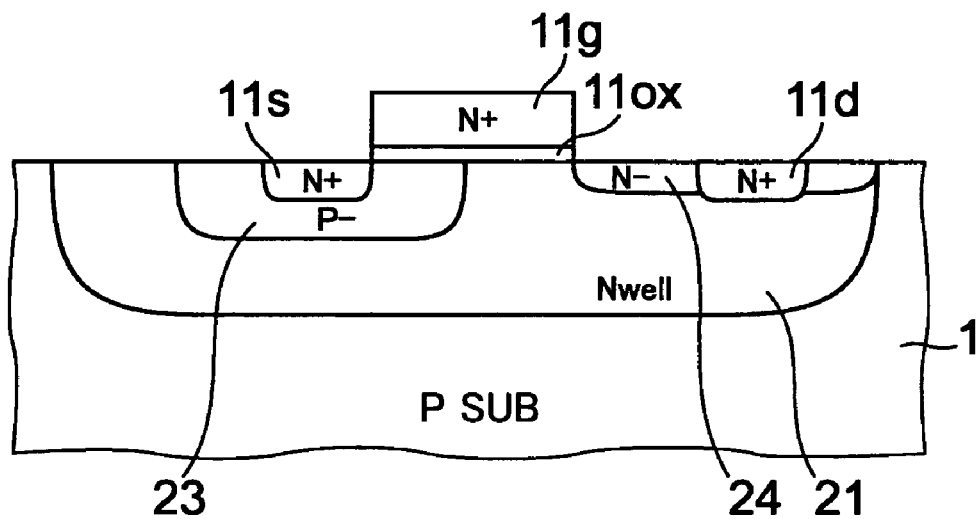
FIG. 3 is a cross-sectional diagram showing further conventional LDMOS transistor.
Figure 4:
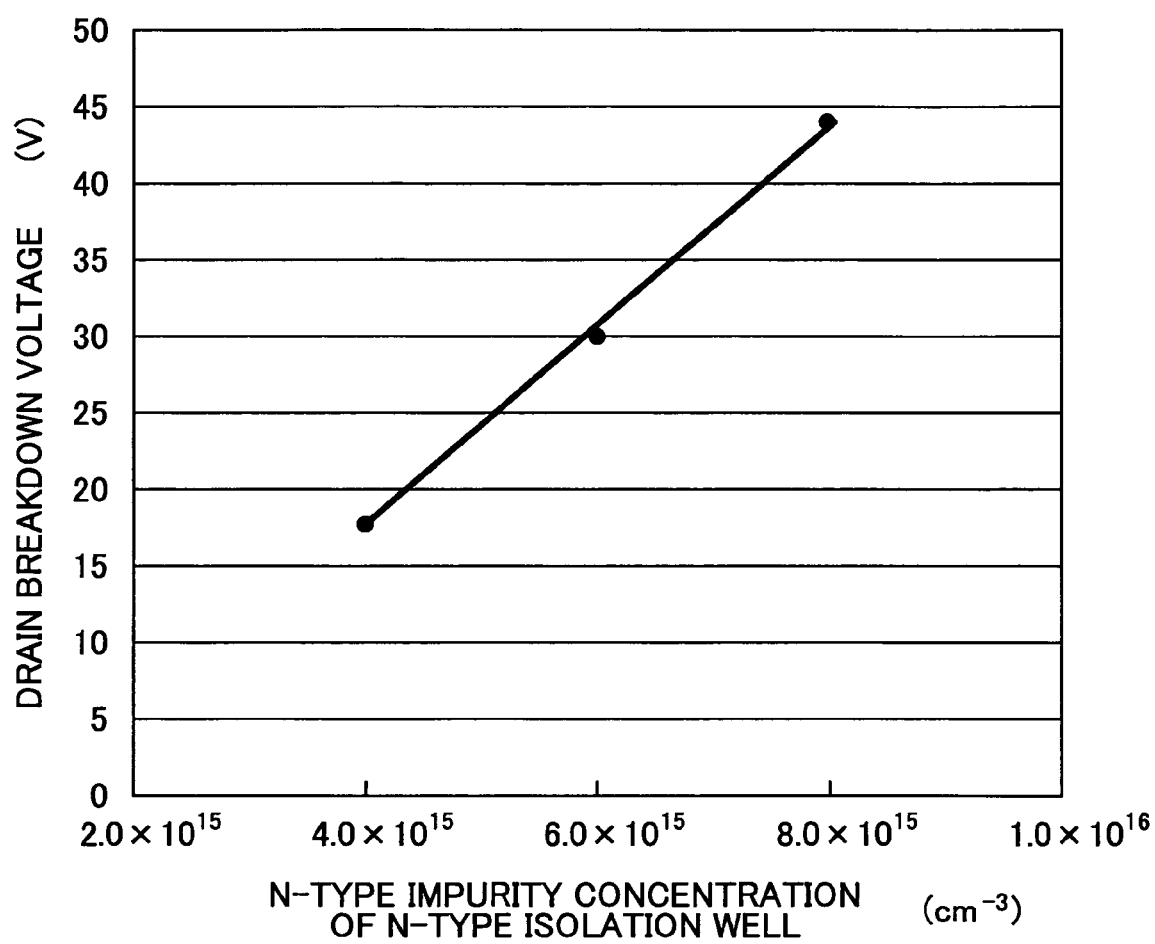
FIG. 4 is a diagram showing the relationship between an impurity concentration level and a drain breakdown voltage of an n-type isolation well for explaining the problems of the conventional art.

Further, the interlayer CVD film 28 is formed over the entire surface of the p-type substrate 1, and contact holes are formed in the interlayer CVD film 28 in correspondence to the p-type source regions 7s and 13s, n-type source regions 9s and 11s, p-type drain regions 7d and 13d and n-type drain regions 9d and 11d, and the metal interconnection 26 is formed in the contact holes and in the interlayer CVD film 28. Reference should be made to FIG. 2.

In the embodiment of FIG. 6, the low voltage CMOS region 3 and the high-voltage CMOS region 5 are formed on the p-type substrate 1, while it is also possible to form these in a common p-type well.

Further, it should be noted that the mode of the present invention applied to the embodiment of FIG. 5 can be applied to the case of using an n-type semiconductor substrate or in the case of forming a low-voltage CMOS region and a high-voltage CMOS region in a common n-type well.

As shown in the present embodiment, it is also possible to improve the drain breakdown voltage from the conventional value of about 33V to about 42V also with the n-channel LDMOS transistor 11 by forming the p-type low concentration well 22 in the n-type drain well 21 by conducting the ion implantation of p-type impurity element such as boron, which is conducted to the p-channel LDMOS transistor 13.

Figure 12:
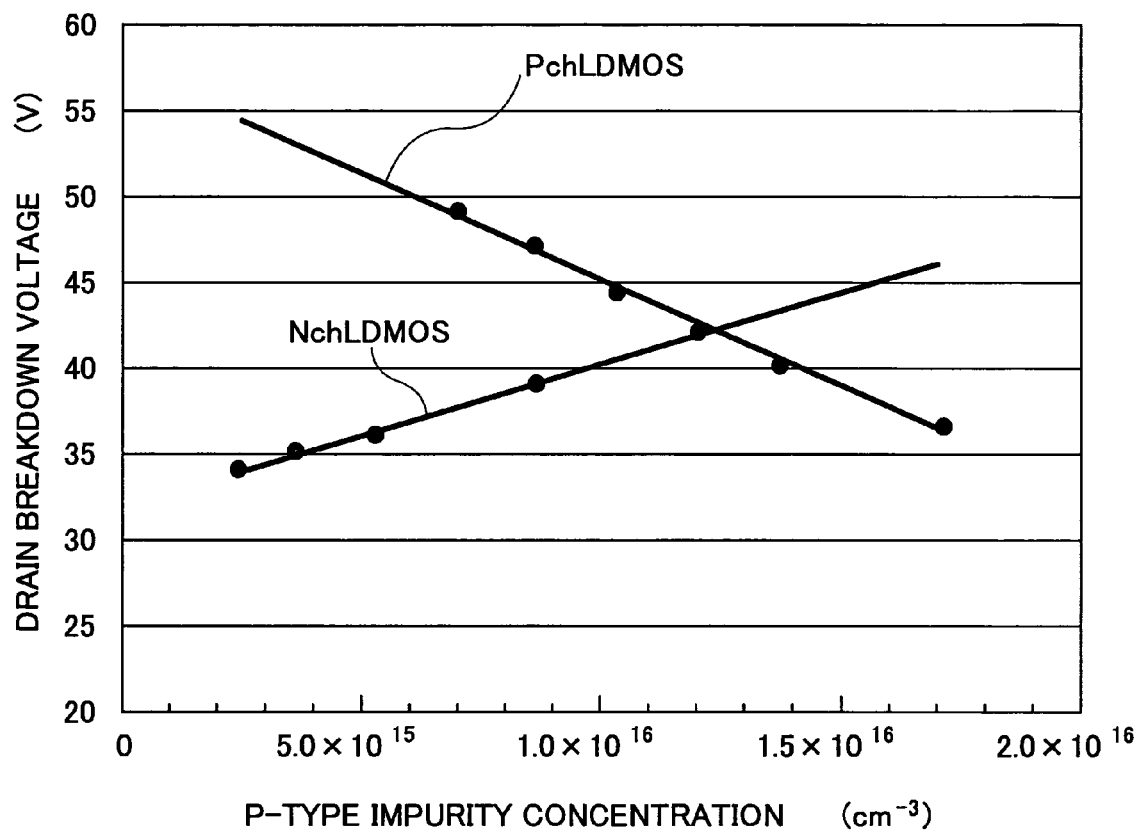
FIG. 12 is a diagram showing the relationship between an impurity concentration level of the p-type low-concentration well and impurity concentration level of the LDMOS transistor of the present invention.

In the case the p-channel LDMOS transistor 13 and the n-channel MOS transistor 11 are formed on the same semiconductor substrate and further forming the p-type low concentration well 27 of the p-channel LDMOS transistor and the p-type low concentration well 22 of the n-channel LDMOS transistor 11 on the same semiconductor substrate in the same step simultaneously ad in the present embodiment, there occurs a decrease in the drain breakdown voltage of the p-channel LDMOS transistor and increase of the drain breakdown voltage in the n-channel LDMOS transistor 11 with increase of the amount of injection of the p-type impurity element as shown in FIG. 12. Thereby, the drain breakdown voltages of the LDMOS transistors 11 and 13 are balanced at about 42V when the p-type impurity concentration level has reached the value of approximately $1.2 \times 10^{16}$ cm$^{-3}$. Thus, with the present embodiment, it is concluded that the preferable impurity concentration level is $1.2 \times 10^{16}$ cm$^{-3}$.

It should be noted that the drive capability of transistor is influenced primarily by the threshold voltage and the contribution of drain resistance per well resistance caused by change of well concentration level is small. Thus, it becomes possible to share the process of forming the n-type isolation well 25 of the p-channel LDMOS transistor 13 and the process of forming the n-type drain well 21 of the n-channel LDMOS transistor 11, and it becomes possible to increase the breakdown voltage of both the n-channel LDMOS transistor and the p-channel LDMOS transistor to 40V or higher without increasing the fabrication process steps such as impurity doping process.

Figure 8:
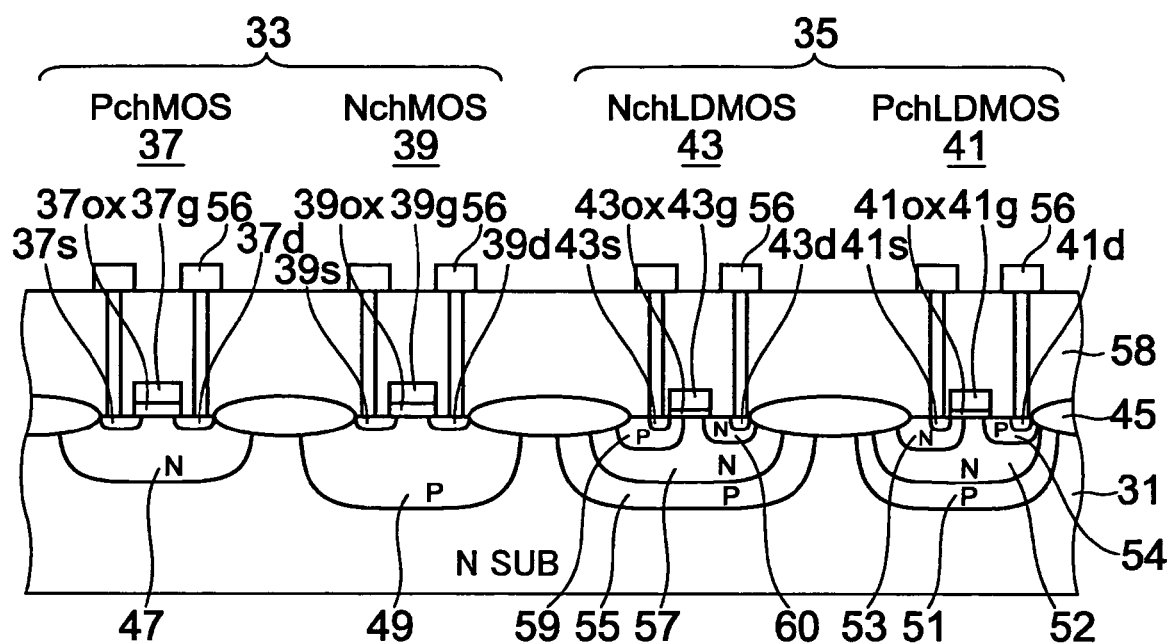
FIG. 8 is a cross-sectional diagram showing a semiconductor device of another embodiment of the present invention.

FIG. 8 is a cross-sectional diagram showing a further embodiment of the semiconductor device of the present invention, wherein the semiconductor device of the present embodiment integrates a p-channel MOS transistor and a conventional n-channel MOS transistor forming a low-voltage CMOS region and a p-channel LDMOS transistor and an n-channel LDMOS transistor forming a high voltage CMOS region on a common semiconductor substrate. Thereby, the semiconductor device of the present embodiment uses the LDMOS transistor of the present invention.

With the present embodiment, an n-type semiconductor substrate (n-substrate) 31 having the substrate resistivity of about 20 Ωcm is used and a low-voltage CMOS region 33 and a high-voltage CMOS region 35 are formed on the semiconductor substrate 31.

Further, a p-channel MOS transistor 37 and an n-channel MOS transistor 39 are formed on the low-voltage CMOS region 33. The p-channel MOS transistor 37 and the n-channel MOS transistor 39 are operated with a supply voltage of 5V, for example.

On the high-voltage CMOS region 35, there are formed a p-channel LDMOS transistor 41 and an n-channel LDMOS transistor 43, wherein the p-channel LDMOS transistor 41 and the n-channel LDMOS transistor 43 may be operated with a supply voltage of 40V, for example.

The p-channel MOS transistor 37 and the n-channel MOS transistor 39, and the p-channel LDMOS transistor 41 and the n-channel LDMOS transistor 43, are separated with each other by a field oxide film 45 formed on the surface of the n-type substrate 31 with a thickness of about 800 nm.

In the part of the low-voltage CMOS region 33 corresponding to the p-channel MOS transistor 37, there is formed an n-type well 47, wherein a p-type source region 37s and a p-type drain region 37d are formed in the n-type well 47 with a mutual separation. Further, there is formed a p-type gate electrode 37g on a part of the n-type well 47 between the p-type source region 37s and the p-type drain region 37d, via a gate oxide film 37ox, wherein a channel region is formed in the surface part of the n-type well 47b right underneath the p-type gate electrode 37g. The gate oxide film 37ox may have a thickness of about 65 nm. The p-type gate electrode 37g is doped with a p-type impurity element such as boron with a concentration level of $1.0 \times 10^{18}$ cm$^{-3}$-$1.0 \times 10^{19}$ cm$^{-3}$, particularly with the dose of $5.0 \times 10^{13}$ cm$^{-2}$. The p-type source region 73s and the p-type drain region 37d are formed in self-alignment with regard to the p-type gate electrode 37g.

The n-type well 47 is doped with an n-type impurity element such as phosphorus, with a concentration of $1.5 \times 10^{16}$ cm$^{-3}$ for the channel region. The p-type source region 37s and the p-type drain region 37d are introduced with boron as the p-type impurity element, with a boron concentration level of $5.0 \times 10^{19}$ cm$^{-3}$. In the p-channel MOS transistor 37, the p-type source region 37s and the p-type drain region 37d are formed with higher impurity concentration level as compared with the channel region.

In the device region corresponding to the n-channel MOS transistor 39, there is formed a p-type well 49 in the n-type substrate 31, wherein an n-type source region 39s and an n-type drain region 39d are formed in the p-type well 49 with a mutual separation. Further, there is formed an n-type gate electrode 39g on a part of the p-type well 49 between the n-type source region 39s and the n-type drain region 39d, via a gate oxide film 39ox, wherein a channel region is formed in the surface part of the p-type well 49 right underneath the n-type gate electrode 39g. The gate oxide film 39ox may have a thickness of about 65 nm. The n-type gate electrode 39g is doped with an n-type impurity element such as phosphorus with a concentration level of $1.0 \times 10^{21}$ cm$^{-3}$, for example by an ion implantation process or solid phase diffusion process. The n-type source region 39s and the n-type drain region 39d are formed in self-alignment with regard to the n-type gate electrode 39g.

The p-type well 49 is doped with a p-type impurity element such as boron, with a concentration of $1.5 \times 10^{16}$ cm$^{-3}$ for the channel region. The n-type source region 39s and the n-type drain region 39d are introduced with phosphorus as the n-type impurity element, with a phosphorus concentration level of $1.0 \times 10^{20}$ cm$^{-3}$, for example. In the n-channel MOS transistor 39, the n-type source region 39s and the n-type drain region 39d are formed with higher impurity concentration level as compared with the channel region.

In the device region of the p-channel LDMOS transistor 41 in the high-voltage CMOS region 35, there is formed a p-type drain well 51 in the n-type substrate 31, and an n-type low-concentration well 52 is formed in the p-type drain well 51. Further, there is formed an n-type channel well 53 in the n-type low-concentration well 52 wherein a part of the n-type channel well 53 functions as the channel region. A p-type source region 41s is formed in the n-type channel well 53, wherein a p-type medium concentration drain region 54 doped with boron is formed in the p-type drain well 51 with separation from the n-type channel well 53 wherein the p-type medium concentration drain region 54 is formed with a concentration higher than the n-type low-concentration well 52. Further, a p-type drain region 41d doped with a p-type impurity element such as boron is formed in the p-type medium concentration drain region 54 with a concentration higher than the p-type medium concentration drain region 54.

Further, a p-type gate electrode 41g of polysilicon is formed over a part of the p-type drain well 51 between the p-type source region 41s and the p-type drain region 41d via a gate oxide film 43ox so as to cover a part of the n-type channel well 53 and a part of the p-type medium drain region 54 but with separation from the drain region 41d. The separation between the p-type gate electrode 41g and the p-type drain region 41d is set for example to 1.5 μm. The gate oxide film 41ox is formed with a thickness of about 30 nm. Thereby, the part of the n-type channel well 53 underneath the p-type gate electrode 41g functions as the channel region. The p-type gate electrode 41g is introduced with a p-type impurity element such as boron with the concentration of $1.0 \times 10^{18}$-$1.0 \times 10^{19}$ cm$^{-3}$, particularly with the dose of $5.0 \times 10^{13}$ cm$^{-2}$ with the present example. It should be noted that the p-type source region 41s, the n-type channel well 53 and the p-type medium concentration drain region 54 are formed in self-alignment to the p-type gate electrode 41g.

The n-type channel well 53 is introduced with phosphorus as the n-type impurity element, and the channel region contains phosphorus with the concentration level of $1.0 \times 10^{17}$ cm$^{-3}$. Further, the p-type drain well 51 is introduced with boron, wherein the p-type drain well 51 contains boron with the concentration level of $8.0 \times 10^{15}$ cm$^{-3}$. Further, the n-type low-concentration well 52 is introduced with an n-type impurity element such as phosphorus, wherein phosphorous concentration between the n-type channel well 53 and the p-type medium concentration drain region is $1.2 \times 10^{16}$ cm$^{-3}$.

In the device region of the n-channel LDMOS transistor 43, there is formed a p-type isolation well 55 in the n-type substrate 31 so as to isolate the LDMOS transistor 43 from the n-type substrate 31. Further, an n-type drain well 57 is formed in the p-type isolation well 55. In the n-type drain well 57, there is formed a p-type channel well 59, wherein a part of the p-type channel well 59 constitutes the channel region. An n-type source region 43s is formed in the p-type channel well 59. In the n-type drain well 57, there is formed an n-type medium concentration drain region 60 doped with an n-type impurity element such as phosphorus with a separation from the p-type channel well 59 wherein the n-type medium concentration drain region 60 contains phosphorus with a concentration level higher than the n-type drain well 57. Further, an n-type drain region 43d is formed in the n-type medium concentration drain region 60 wherein the n-type drain region 43d is doped with an n-type impurity element such as phosphorus with a concentration level higher than the n-type medium concentration drain region 60.

Further, there is formed a gate electrode 43g of n-type polysilicon via a gate oxide film 43ox so as to extend over a part of the n-type drain well 57 located between the n-type source region 43s and the n-type drain region 43d with a separation from the n-type drain region 43d, such that the gate electrode 43g further covers a part of the p-type channel well 59 and a part of the n-type medium-concentration drain region 60. Thereby, the separation between the n-type gate electrode 43g and the n-type drain region 43d is set for example to 2.0 μm, while the gate oxide film 43ox may have a thickness of about 30 nm, for example. The surface of the p-type channel well 59 located underneath the n-type gate electrode 43g serves for the channel region. It should be noted that the n-type gate electrode 43g is introduced with phosphorus by an ion implantation process or solid diffusion process with a concentration level of $1.0 \times 10^{21}$ cm$^{-3}$. The n-type source region 43s, the p-type channel well 59 and the n-type medium concentration drain region 60 are formed in self-alignment to the n-type gate electrode 43g.

The p-type channel well 59 is introduced with boron as the p-type impurity element with a concentration level of $1.0 \times 10^{17}$ cm$^{-3}$. The n-type drain well 60 is introduced with phosphorus as the n-type impurity element with the concentration level of $1.2 \times 10^{16}$ cm$^{-3}$ for the part between the n-type drain region 43d and the p-type channel well 59. In the n-channel LDMOS transistor 43, the drain region has an impurity concentration level lower than the channel region.

Further, there is formed an interlayer CVD film 58 over the entire surface of the n-type substrate 31 by a CVD (chemical vapor deposition) process. The interlayer insulation film 58 is formed with a metal interconnection 56 of aluminum, for example. Thereby, the metal interconnection 56 is connected electrically to the p-type source regions 37s and 41s, n-type source regions 39s and 43s, p-type drain regions 37d and 41d and n-type drain regions 39d and 43d via respective contact holes.

With this embodiment, the gate oxide films 37ox and 39ox have a thickness of about 65 nm in the p-channel MOS transistor 37 and the n-channel MOS transistor 39 wherein this film thickness is larger than the film thickness of the gate oxide film 41ox or 43ox of the p-channel LDMOS transistor 41 or the n-channel LDMOS transistor 43 of about 30 nm. It should be noted that the p-type well 49 of the n-channel MOS transistor 39, the p-type drain well 51 of the p-channel LDMOS transistor 41 and the p-type isolation well 55 of the n-channel LDMOS transistor 43 are formed simultaneously. Further, the n-type well 47 of the p-channel MOS transistor 37, the n-type drain well 57 of the n-channel LDMOS transistor 43 and the n-type low-concentration region 52 of the p-channel LDMOS transistor 41 are formed simultaneously.

With regard to the p-channel LDMOS transistor 41 and the p-channel LDMOS transistor 43, the medium concentration drain regions 54 and 60 are formed respectively adjacent to the p-type gate electrode 41g and the n-type gate electrode 43g in self-alignment, and thus, it is possible to reduce the drain resistance and stabilize the transistor characteristics. Further, because the p-type source region 41s and the n-type source region 43s are formed respectively in self-alignment with regard to the p-type gate electrode 41g and the n-type gate electrode 43g, it is possible to reduce the source resistance and stabilize the transistor characteristics.

While the present embodiment describes the semiconductor device that includes the p-channel MOS transistor 37, the n-channel MOS transistor 39, the n-channel LDMOS transistor 41 and the p-channel LDMOS transistor 43 on the same n-type substrate 31, the present invention is by no means limited to such a specific construction but may be applied to any semiconductor device that has an LDMOS transistor.

The semiconductor device of the embodiment of FIG. 8 can be fabricated similarly by reversing the conductivity type in the fabrication process explained from FIG. 6 and FIGS. 7A-7L.

FIGS. 9A-9L are diagrams showing the fabrication process of the semiconductor device of FIG. 8. Hereinafter, the fabrication process of the present embodiment will be described with reference to FIGS. 9A-9L and further with reference to FIG. 8.

Figure 9A:
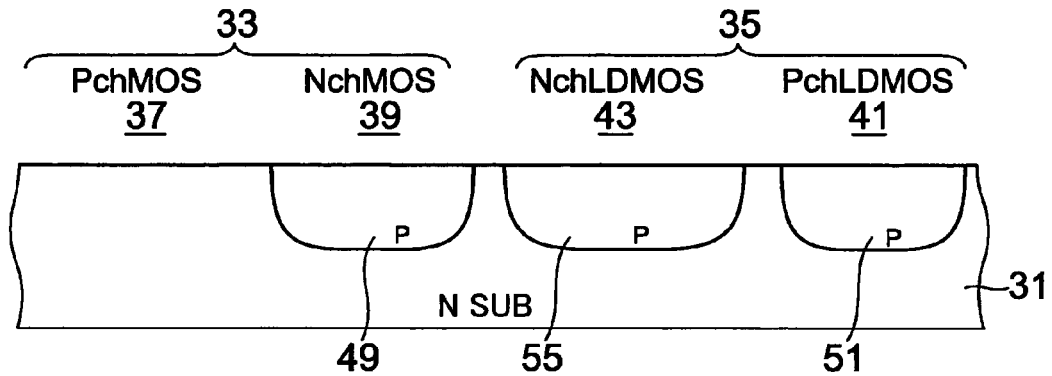
FIGS. 9A-9L are cross-sectional diagrams showing the process steps for fabricating the semiconductor device of FIG. 6.

(1) Referring to FIG. 9A, a resist pattern is formed on the n-type substrate 31 such that the resist pattern has resist openings in correspondence to the device region of the n-channel MOS transistor 39 in the low-voltage CMOS region 33 and the device regions of the p-channel LDMOS transistor 41 and the n-channel LDMOS transistor 43 in the high-voltage CMOS region 35, and ion implantation of boron is conducted into the n-type silicon substrate 31 under the acceleration energy of 50 keV with the dose of about $4.0 \times 10^{12}$ cm$^{-2}$ while using the resist pattern as a mask. Further, after removing the resist pattern, thermal activation is conducted at 1180° C. for 24 hours. With this, the p-type well 49, the p-type isolation well 55 and the p-type drain well 51 are formed simultaneously.

Figure 9B:
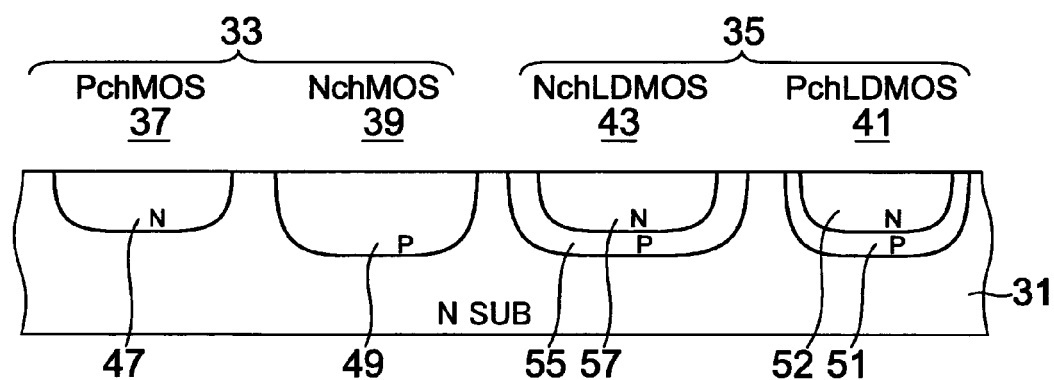

(2) Next, in the step of FIG. 9B, a resist pattern is formed on the n-type substrate 31 such that the resist pattern has resist openings in correspondence to the device region of the p-channel MOS transistor 37 and the device regions of the n-channel LDMOS transistor 43 in the p-type isolation well 55 and the p-channel LDMOS transistor 41 in p-type drain well 51, and ion implantation of phosphorus is conducted into the n-type silicon substrate 31 under the acceleration energy of 150 keV with the dose of about $3.0 \times 10^{12}$ cm$^{-2}$ while using the resist pattern as a mask. Further, after removing the resist pattern, thermal activation is conducted at 1150° C. for 8 hours. With this, the n-type well 47, the n-type drain well 57 and the n-type low-concentration well 52 are formed simultaneously, respectively in the device region of the p-channel MOS transistor 37, the p-type isolation well 55 and in the p-type drain well 51. Thereby, the well 47, the well 57 and the well 52 contains the same n-type impurity element with the same concentration level.

Figure 9C:
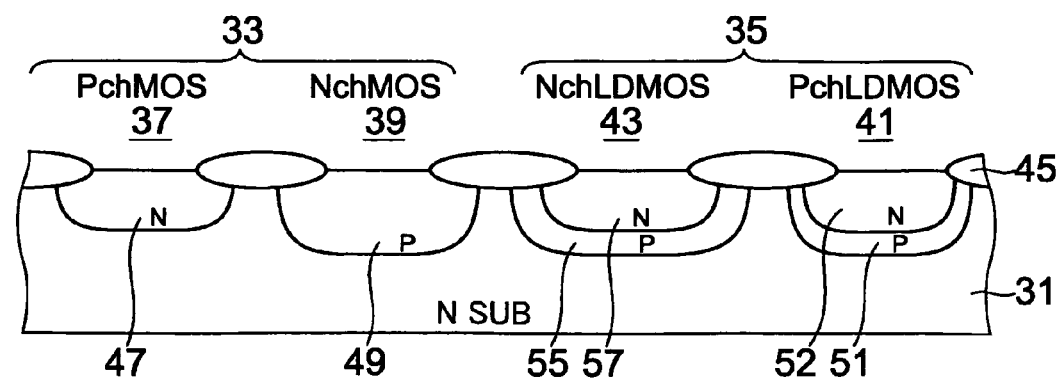

(3) Next, in the step of FIG. 9C, a field oxide film 45 is formed on the surface of the n-type substrate 41 by a LOCOS oxidation process with the thickness of 800 nm, such that the regions of the transistors 37, 39, 41 and 43 are defined. In this step, it is also possible to form an impurity region under the field oxide films 45 for the purpose of channel stopper.

Figure 9D:
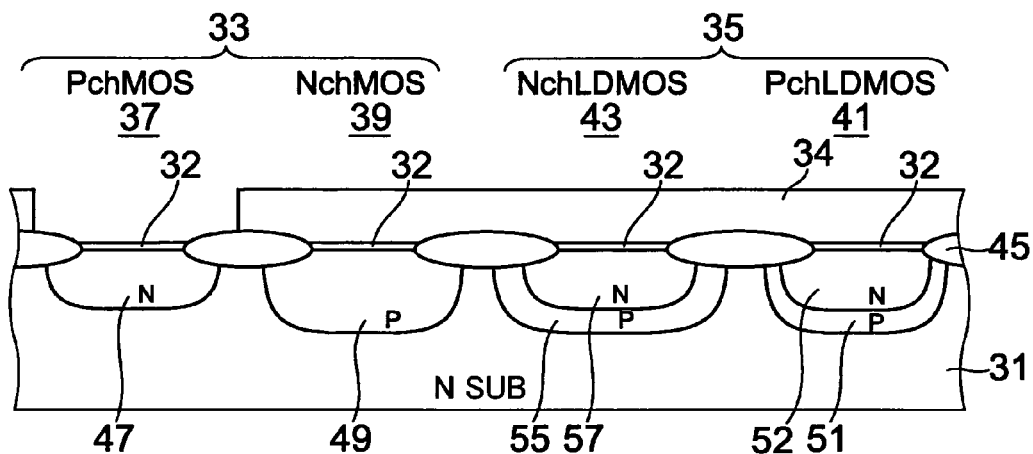

(4) Next, in the step of FIG. 9D, a pre-gate oxide film 32 is formed over the surfaces of the n-type well 47, the p-type well 49, the p-type drain well 51 and the n-type drain well 57 with the thickness of 40 nm. Further, a resist pattern 34 is formed thereon such that the resist pattern 34 has a resist opening in correspondence to the device region of the p-channel MOS transistor 37, and channel doping is conducted into the n-type well 47 for the purpose of threshold control while using the resist pattern 34 as a mask.

Figure 9E:
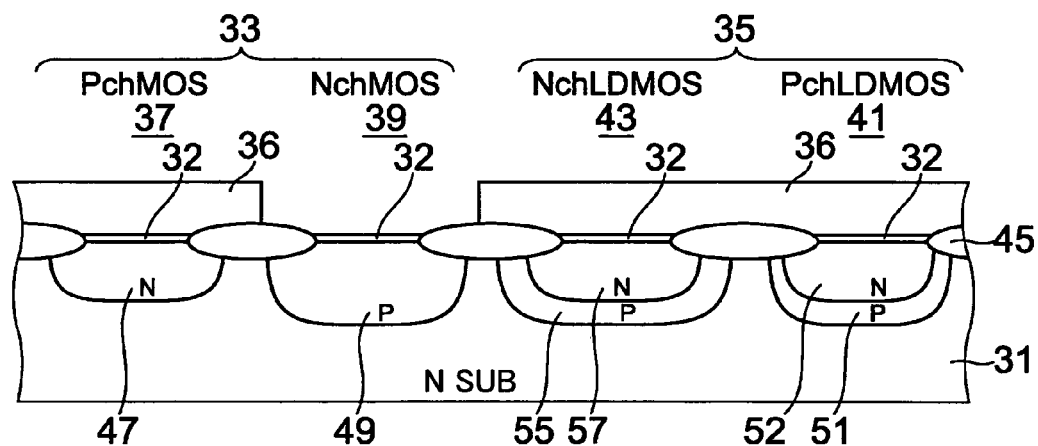

(5) Next, in the step of FIG. 9E, the resist pattern 34 is removed and a resist pattern 36 is formed so as to have an opening in correspondence to the device region of the n-channel MOS transistor 39. Further, while using the resist pattern 36 as a mask, channel doping is conducted to the p-type well 39 for the purpose of threshold control.

Figure 9F:
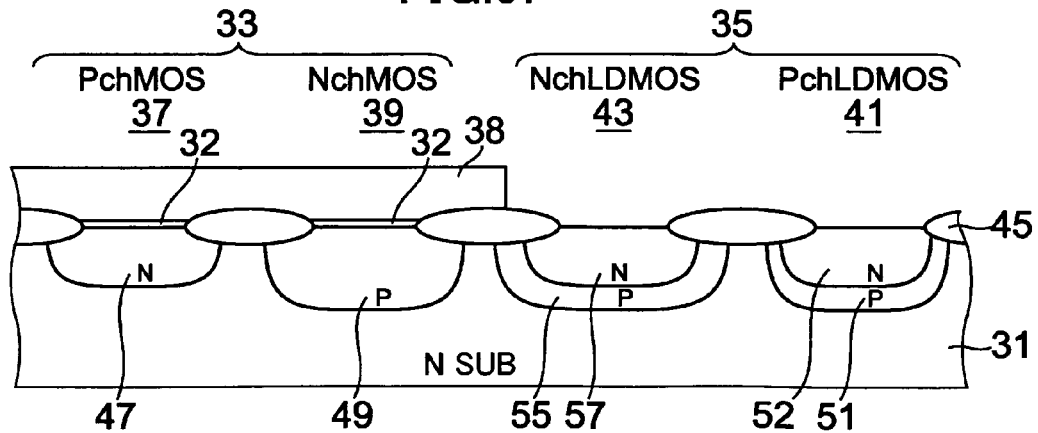

(6) Next, in the step of FIG. 9F, the resist pattern 36 is removed, and a resist pattern 38 is formed such that the resist pattern 38 as openings in correspondence to the device regions of the p-channel LDMOS transistor 41 and the n-channel LDMOS transistor 43. Further, the pre-gate oxide films 32 on the surface of the p-type drain well 51 and the n-type drain well 57 are removed by using a hydrofluoric acid.

Figure 9G:
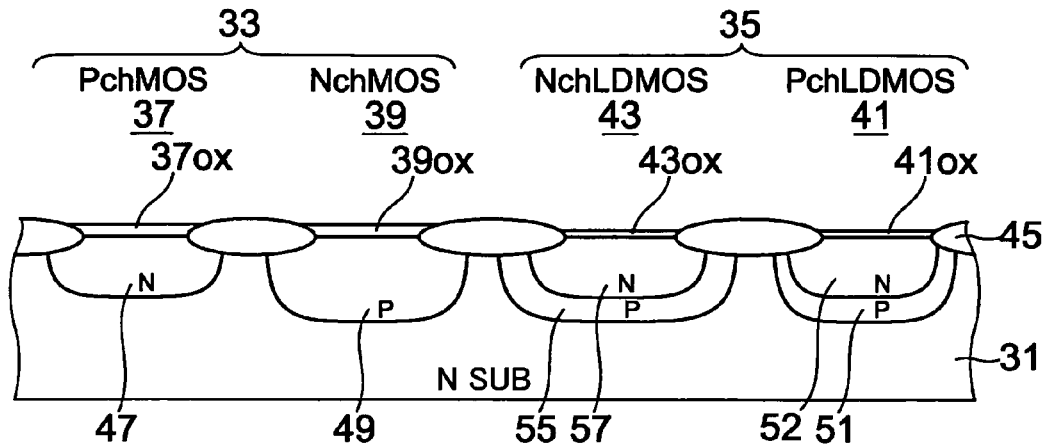

(7) Next, in the step of FIG. 9G, the resist pattern 38 is removed and a thermal oxidation processing is conducted. With this, a gate oxide film 41$ox$ and a gate oxide film 43$ox$ are formed respectively on the surface of the n-type drain well 51 and the p-type drain well 57 with a thickness of about 30 nm. With this thermal processing, it should be noted that the surface of the n-type well 47 and the surface of the p-type well 49 are also oxidized and there are formed gate oxide films 37$ox$ and 39$ox$ respectively on the surfaces of the n-type well 47 and the p-type well 49 with a thickness of 65 nm.

Figure 9H:
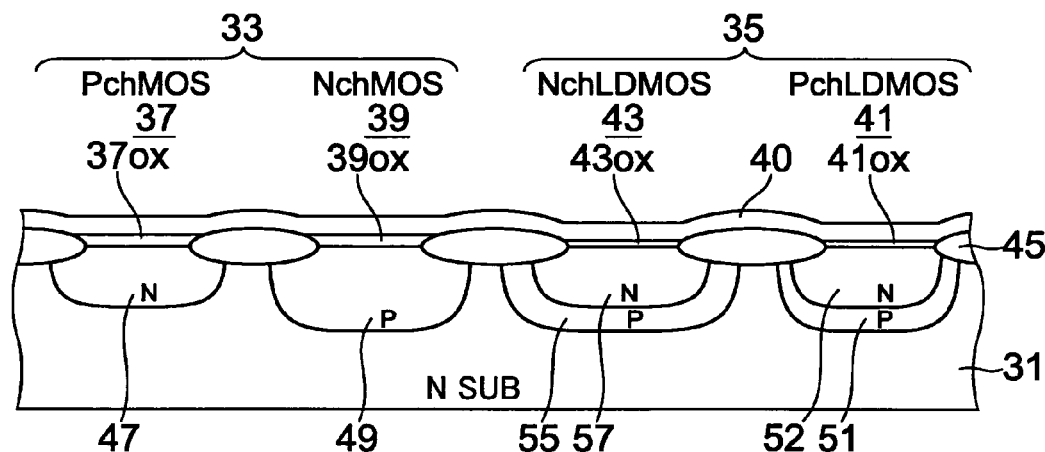

(8) Next, in the step of FIG. 9H, a polysilicon film 40 is formed on the entire surface of the n-type substrate 31 by a CVD process with a thickness of 500 nm. Further, a silicon oxide not illustrated is formed on the surface of the polysilicon film 40 with a thickness of 25 nm by a thermal oxidation processing conducted at a process temperature of 850° C.

Figure 9I:
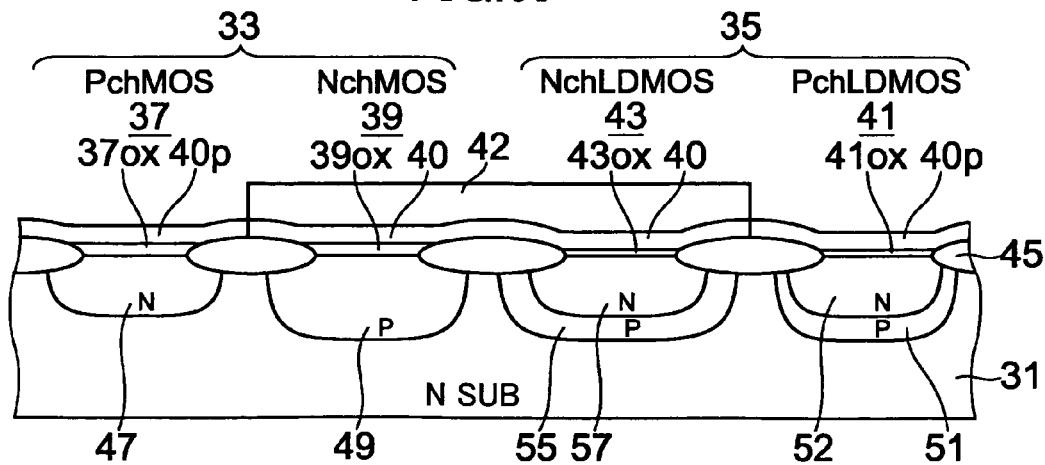

(9) Next, in the step of FIG. 9I, a resist pattern 42 is formed on the polysilicon film 40 such that the resist pattern 42 has an opening in correspondence to the device region of the p-channel MOS transistor 37 and the device region of the p-channel LDMOS transistor 41, and a p-type polysilicon film 40$p$ is formed by introducing boron into the polysilicon film under the acceleration voltage of 15 keV with the dose of about $5.0 \times 10^{13}$ cm$^{-2}$ while using the resist pattern 42 as a mask.

Figure 9J:
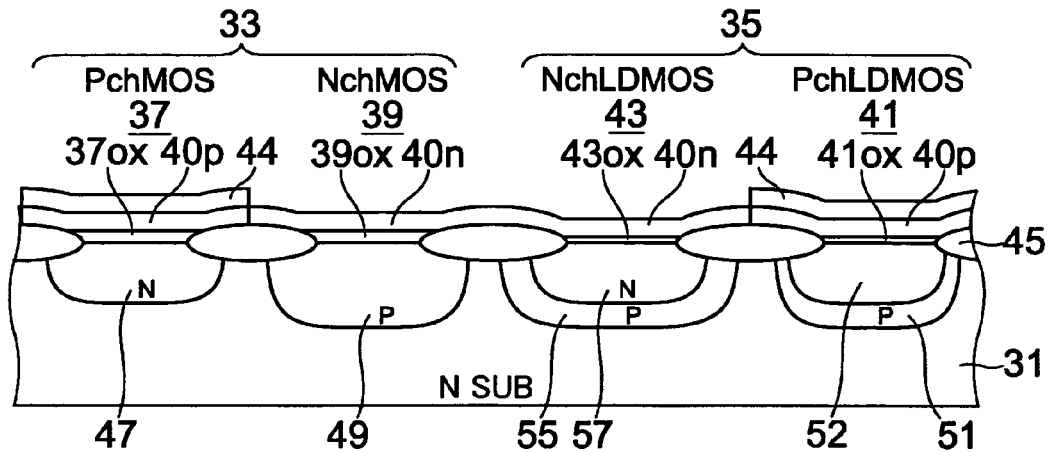

(10) Next, in the step of FIG. 9J, the resist pattern 42 is removed and a silicon oxide film 44 is formed on the entire surface of the semiconductor substrate 1 by a CVD process with the thickness of 200 nm. Further, photolithographic process is conducted and an opening is formed in the silicon oxide film 44 in correspondence to the device region of the n-channel MOS transistor 39 and the device region of the n-channel LDMOS transistor 43. Further, phosphorus is deposited on the entire surface of the n-type substrate 31 and an n-type polysilicon film 40$n$ is formed after conducting a thermal annealing process at 900° C. for 30 minutes. It should be noted that the formation of the n-type polysilicon film 40$n$ may be conducted by an ion implantation process.

Figure 9K:
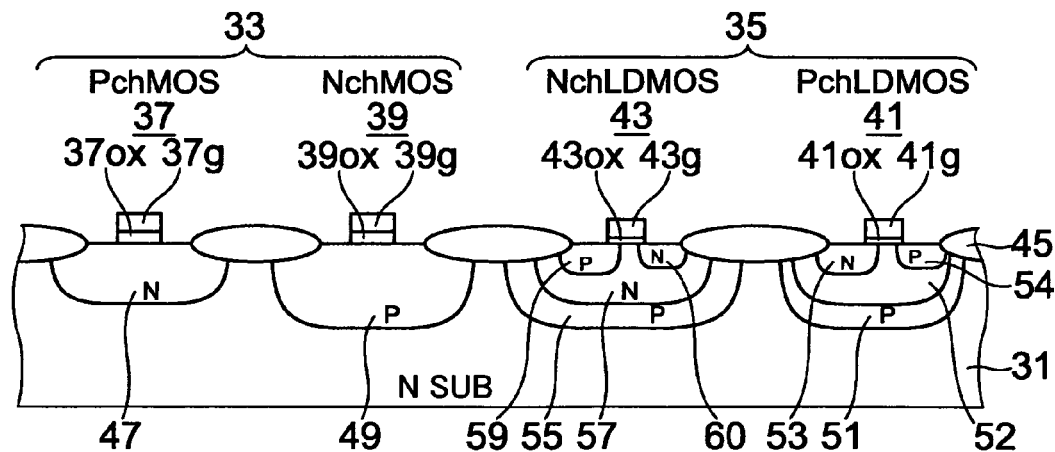

(11) Next, in the step of FIG. 9K, the silicon oxide film 44 is removed and the polysilicon film 40$n$ of n-type and the polysilicon film 40$p$ of p-type thus formed are subjected to a patterning process. With this, the p-type gate electrode 37$g$ of p-type polysilicon is formed on the gate oxide film 37$ox$ in the device region of the p-channel MOS transistor 37, the n-type gate electrode 39$g$ is formed on the gate oxide film 39$ox$ in the device region of the n-channel LDMOS transistor 39, the p-type gate electrode 41$g$ of p-type polysilicon is formed on the gate oxide film 41$ox$ in the device region of the p-channel LDMOS transistor 41, and the n-type gate electrode 43$g$ of n-type polysilicon is formed on the gate oxide film 43$ox$ in the device region of the n-channel LDMOS transistor 43, wherein the gate electrodes 37$g$, 39$g$, 41$g$ and 43$g$ are formed simultaneously.

Further, a resist pattern is formed such that the resist pattern has an opening in correspondence to the region where the p-type channel well 59 of the n-channel LDMOS transistor 43 is to be formed including the gate electrode 43$g$, and ion implantation of boron is conducted under the acceleration energy of 30 keV with the dose of about $3.3 \times 10^{13}$ cm$^{-2}$ while using the resist pattern and the n-type gate electrode 43$g$ as a mask, and with this, the p-type channel well 59 is formed adjacent to the n-type gate electrode 43$g$.

Further, a resist pattern having an opening in correspondence to the region where the n-type channel well 53 of the p-channel LDMOS transistor 41 is to be formed including the p-type gate electrode 41$g$, and ion implantation of phosphorus is conducted under the acceleration voltage of 100 keV with the dose of about $3.3 \times 10^{13}$ cm$^{-2}$ while using the resist pattern and the p-type gate electrode 41$g$ as a mask. With this, the n-type channel well 53 is formed adjacent to the p-type gate electrode 41$g$.

Further, a resist pattern is formed such that the resist pattern has an opening in correspondence to the region where the n-type medium concentration drain region 60 of the n-channel LDMOS transistor 43 is to be formed including the n-type gate electrode 43$g$, and the n-type medium concentration drain region 60 is formed adjacent to the n-type gate electrode 43$g$ by introducing phosphorus into the n-type drain well 57 under the acceleration energy of 100 keV with the dose of about $3.0 \times 10^{12}$ cm$^{-2}$ while using the resist pattern and the n-type gate electrode 43$g$ as a mask.

Further, a resist pattern is formed such that the resist pattern has an opening in correspondence to the region where the p-type medium concentration drain region 54 of the p-channel LDMOS transistor 41 is to be formed including the p-type gate electrode 41$g$, and the p-type medium concentration drain region 54 is formed adjacent to the p-type gate electrode 41$g$ by introducing boron into the p-type drain well 51 under the acceleration energy of 30 keV with the dose of about $4.0 \times 10^{12}$ cm$^{-2}$ while using the resist pattern and the p-type gate electrode 41$g$ as a mask.

Thereafter, thermal activation processing is conducted at the process temperature of 1100° C. for the duration of 200 minutes, and with this, the n-type channel well 53, the p-type medium concentration drain region 54, the p-type channel well 59 and the n-type medium concentration region 60 are formed as a result of the diffusion of the respective impurity elements.

Figure 9L:
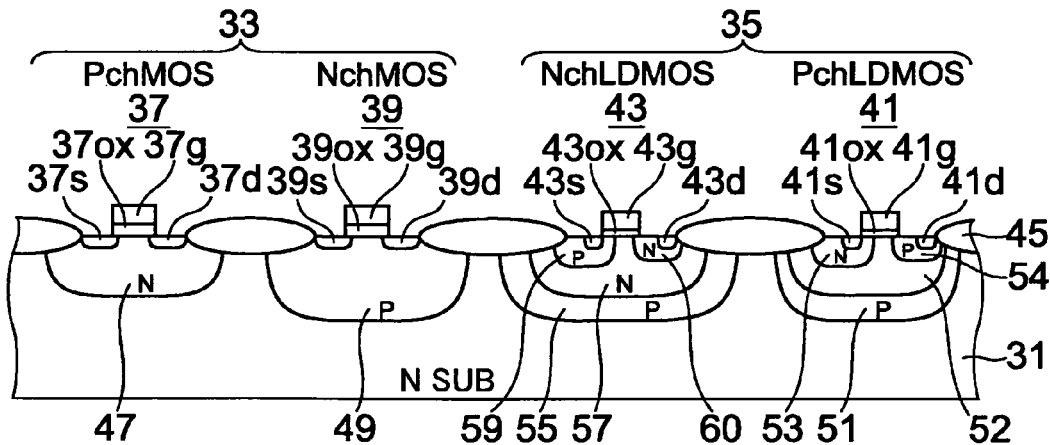

(12) Next, in the step of FIG. 9L, a resist pattern is formed over the n-type substrate 31 such that the resist pattern has openings respectively in correspondence to the p-type well 49 in the device region of the n-channel MOS transistor 39, the region of the p-type channel well 59 of the device region of the n-channel LDMOS transistor 43 adjacent to the n-type gate electrode 43g, and further in the n-type medium concentration drain region 60. Thereby, the resist pattern is formed such that there exists a resist pattern having a width of 2.0 μm on the n-type medium concentration drain region 60 adjacent to the n-type gate electrode 43g. Further, ion implantation of phosphorus or arsenic is conducted to the p-type well 49, the p-type channel well 59 and further the n-type medium drain region 60 under the acceleration energy of 50 keV with the dose of about $6.0 \times 10^{15}$ cm$^{-2}$ while using the resist pattern as a mask.

After removing the resist pattern, a resist pattern is formed over the n-type substrate 31 such that the resist pattern includes openings in correspondence to the n-type well 47 in the device region of the p-channel MOS transistor 37, the region of the n-type well 53 in the device region of the p-channel LDMOS transistor 41 adjacent to the p-type gate electrode 41g, and the p-type medium concentration drain region 54. Thereby, the resist pattern is formed such that there exists a resist patter of the width of 1.5 μm over the p-type medium concentration drain region 54 adjacent to the p-type gate electrode 41g. Further, while using the resist pattern as a mask, ion implantation of boron is conducted simultaneously to the p-type well 49, the n-type channel well 53 and the p-type medium concentration drain region 54 under the acceleration energy of 30 keV with the dose of $1.5 \times 10^{15}$ cm$^{-2}$.

Further, after removal of the resist pattern, a thermal activation processing is conducted, and with this, the p-type source region 37s and the p-type drain region 37d are formed in the n-type well 47 in the device region of the p-channel MOS transistor 37, the n-type source region 39s and the n-type drain region 39d are formed in the p-type well 49 in the device region of the n-channel MOS transistor 39. Further, in the device region of the p-channel LDMOS transistor 41, the p-type source region 41s is formed in the n-type channel well 53 while the p-type drain region 41d is formed in the p-type medium concentration drain region 54. In the device region of the n-channel LDMOS transistor 43, the n-type source region 43s is formed in the p-type channel well 59 while the n-type drain region 43d is formed in the n-type medium concentration drain region 60. Thereby, it should be noted that, in order to relax the gate electric field, the p-type drain region 41d of the p-channel LDMOS transistor 41 is formed with a separation of about 1.5 μm from the p-type gate electrode 41g. Similarly, the n-type drain region 43d of the n-channel LDMOS transistor 43 is formed with a separation of about 2.0 μm from the n-type gate electrode 43g.

Further, the interlayer CVD film 58 is formed over the entire surface of the n-type substrate 31, and contact holes are formed in the interlayer CVD film 58 in correspondence to the p-type source regions 37s and 41s, n-type source regions 39s and 43s, p-type drain regions 37d and 41d and n-type drain regions 39d and 43d, and the metal interconnection 56 is formed in the contact holes and in the interlayer CVD film 58. Reference should be made to FIG. 6.

In the embodiment of FIG. 6, the low voltage CMOS region 33 and the high-voltage CMOS region 35 are formed on the n-type substrate 31, while it is also possible to form these in a common n-type well.

Figure 10:
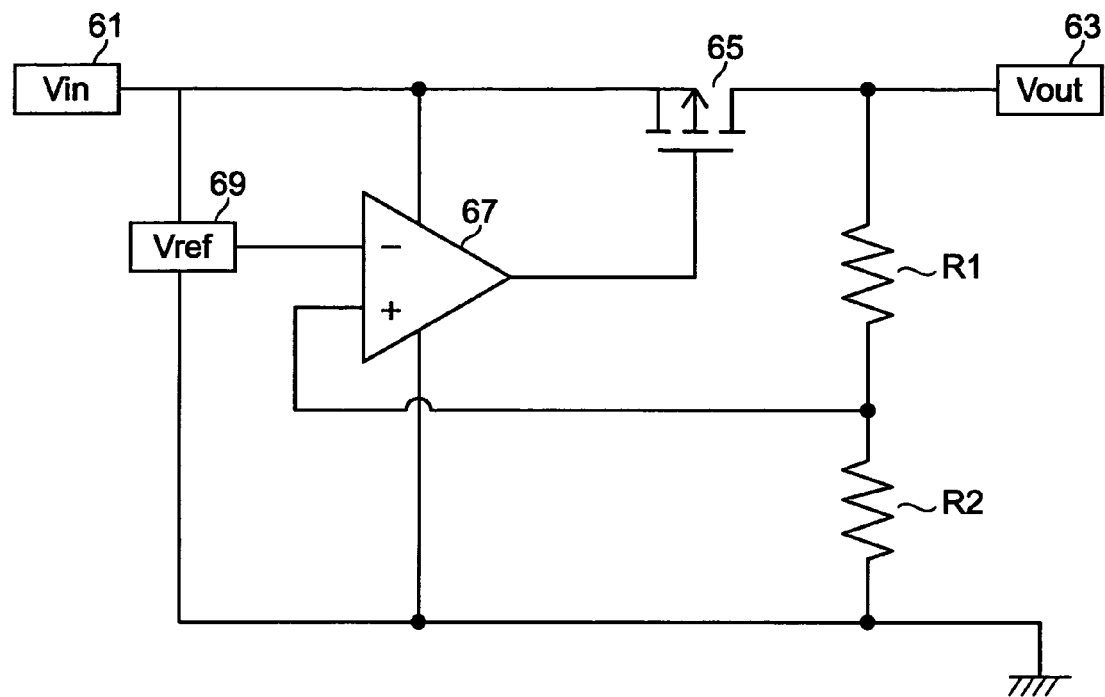
FIG. 10 is a circuit diagram showing an embodiment of a power supply unit

FIG. 10 is a circuit diagram showing an embodiment of a constant voltage circuit according to the present invention in which the semiconductor device of the present invention is used.

Referring to FIG. 10, there is provided, between an input terminal (Vin) 61 connected to a power supply and an output terminal (Vout) 63 connected to a load, a p-channel LDMOS transistor 65 that constitutes an output transistor.

Further, there is provided a differential amplifier circuit 67, and an output terminal of the differential amplifier circuit 67 is connected to the gate electrode of the p-channel LDMOS transistor 65. Further, the differential amplifier circuit 67 has an inverting input terminal connected to a reference voltage generator circuit (Vref) 69. Thereby, a reference voltage is supplied to the inverting input terminal from the reference voltage generator. Further, the in-inverting input terminal is supplied with a voltage formed by dividing the output voltage of the p-channel LDMOS 65 by the resistances R1 and R2 forming a voltage divider. The power of the differential amplifier 67 and the reference voltage generator 69 is supplied from the input terminal 61. The differential amplifier 67, the reference voltage generator 69 and the resistance R2 are grounded.

With this embodiment, the LDMOS transistor of the present invention is used for the p-channel LDMOS transistor 65. Thus, it should be noted that the p-channel LDMOS transistor 65 has a gate oxide breakdown voltage of 40V.

In the case of obtaining an output voltage lower than the input voltage to the input terminal, the output voltage is produced by dividing the input voltage by a voltage divider, wherein it is necessary to change the ON resistance of the p-channel LDMOS transistor 65 according to the output current supplied to an external load from the output terminal in order to maintain the output voltage constant with such a constant voltage circuit. Thus, with the present embodiment, the reference voltage from the reference voltage generator is compared with the output voltage divided out by the resistances R1 and R2 by using the differential amplifier 67.

Figure 11:
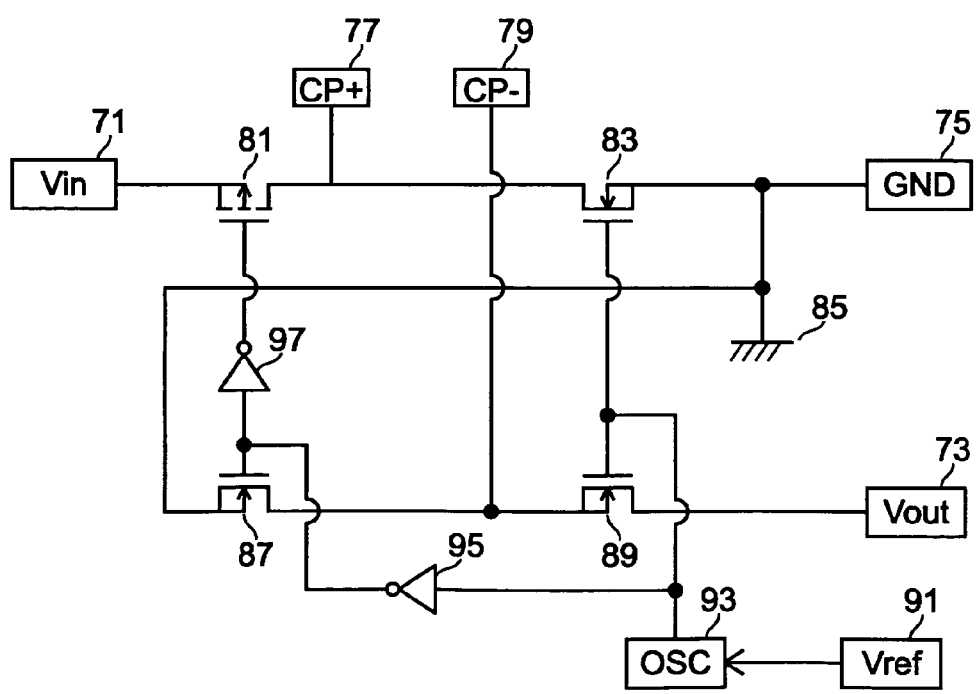
FIG. 11 is a circuit diagram showing a DC/DC converter to which the semiconductor device of the present invention is applied.

FIG. 11 is a circuit diagram showing an example of an inversion type charge-pump DC/DC converter that uses the semiconductor device of the present invention.

Referring to FIG. 11, the DC/DC converter includes an input terminal (Vin) 71, an output terminal (Vout; inverted output) 73, a ground terminal (GND) 75, a plus-side terminal (CP+) 77 of pump capacitor, and a minus-side terminal (CP−) 79 of pump capacitor, wherein there is provided an external capacitor not illustrated between the terminals 77 and 79.

Inside the DC/DC converter, there are provided a p-channel LDMOS transistor 81 and an n-channel MOS transistor 83 consecutively between the input terminal 71 and the ground terminal 75, and the positive-side terminal 77 of the pump capacitor is provided between the p-channel LDMOS transistor 81 and the n-channel MOS transistor 83. Further, the node between the n-channel MOS transistor 83 and the ground terminal 75 is connected to a ground potential 85.

Between the ground potential and the output terminal, there are connected consecutively n-channel MOS transistors 87 and 89. Further, a pumping capacitor 79 is connected between the n-channel MOS transistors 87 and 89.

Further, there is provided an oscillator circuit (OSC) 96 that produces alternately a voltage (Vin voltage) identical in magnitude to the voltage at the input terminal 71 and a voltage (GND voltage) identical to the voltage at the ground terminal 75. Further, the output terminal of the oscillator circuit 93 is connected directly to the gate electrodes of the n-channel MOS transistors 83 and 89 and further to the gate electrode of the n-channel MOS transistor 87 via an inverter 95 and to the gate electrode of the p-channel LDMOS transistor 81 via inverters 95 and 97.

With this inversion type charge pump DC/DC converter, switching is caused in the four transistors 81, 83, 87 and 89 by providing a voltage to the respective gate electrodes thereof by way of the oscillator circuit 93. Thereby, the pump capacitor connected between the positive-side terminal 77 and the negative-side terminal 79 undergoes charging and discharging and the current associated with this charge/discharge operation of the capacitor appears as an output at the output terminal 73, wherein this output voltage becomes inversion of the input voltage supplied to he input terminal 71.

When the oscillator circuit 93 has produced the ground voltage GND, the p-channel LDMOS transistor 81 and the n-channel MOS transistor 87 are turned ON while the remaining n-channel MOS transistors 83 and 89 are turned OFF. In this state, the capacitor connected between the positive-side terminal 77 and negative-side terminal 79 undergoes charging.

On the other hand, when the oscillator circuit 93 has produced the Vin voltage, the p-channel LDMOS transistor 81 and the n-channel MOS transistor 87 are turned off, while the remaining two n-channel MOS transistors 83 and 89 are turned ON. In this state, the capacitor thus charged in the previous phase causes discharging, and the electric charges accumulated in the capacitor are output from the output terminal 73 in the form of inverted voltage in view of the fact that the output terminal 73 is set to a voltage lower than the ground terminal 75.

By repeating the foregoing operations, the current continues to flow in the form of inversion of the input voltage.

Figure 13A:
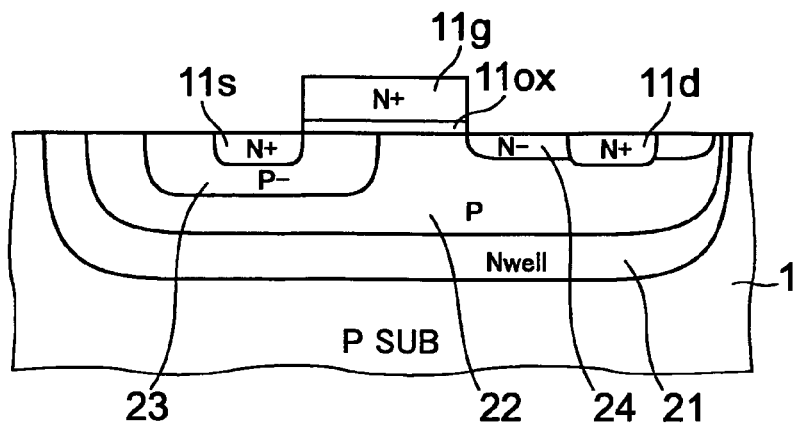
FIGS. 13A-13D are cross-sectional diagrams showing a further embodiment of the LDMOS transistor of the present invention.
Figure 13B:
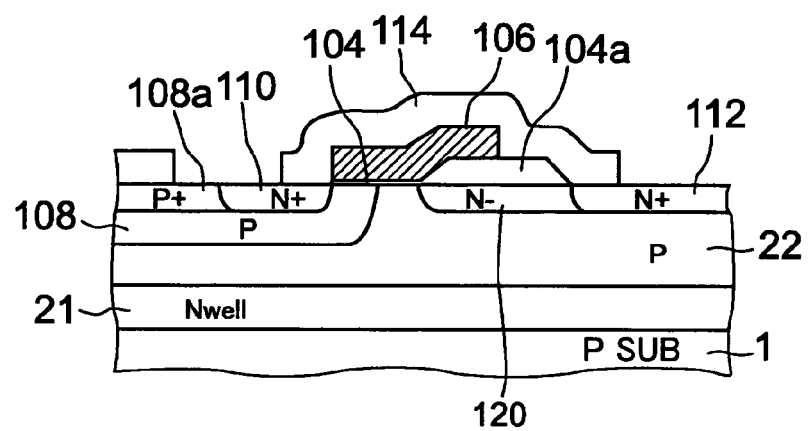
Figure 13C:
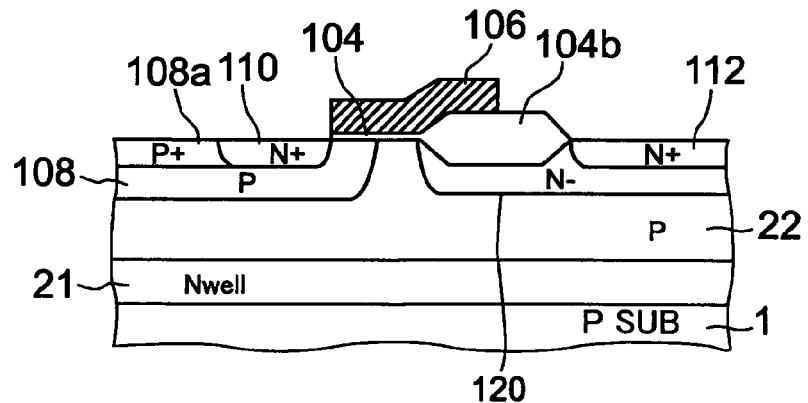

It should be noted that the present invention is applicable to other LDMOS transistors that have a construction different from those of the foregoing embodiments. For example, the present invention can be applicable to the device of the related art shown FIG. 16 in which drain region 11*d* is formed deeper than the medium concentration drain region 24 as shown in FIG. 13A. Alternatively, the present invention is applicable to the related art structure of FIG. 14B as shown in FIG. 13B, in which the thickness of the gate oxide film 104*a* is increased at the drain edge. Further, as shown in FIG. 13C, it is possible to apply the present invention to the related art structure of FIG. 14C in which the field oxide film 104*b* is formed at the drain edge with a thickness larger than the thickness of the gate oxide film. In any of these, it becomes possible to improve the drain breakdown characteristics without decreasing the impurity concentration level in the drain well 21 and the medium concentration drain region 24 or 120, by forming the low-concentration drain region 22 inside the drain well 21.

Figure 13D:
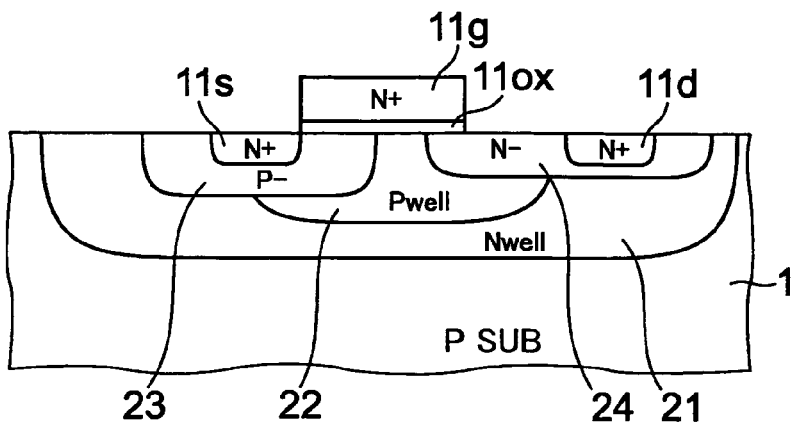

Further, the LDMOS transistor of the present invention is not limited to those explained heretofore in which the p-type low-concentration well 22 includes all of the p-type channel well 23 and the n-type medium concentration drain region 24, but also to those in which the low-concentration well includes only one of the channel well and the low-concentration drain region for the entirety thereof and the other of the channel well and the medium concentration drain region is included only partially. Alternatively, as shown in FIG. 13D, it is possible to construct such that the low-concentration well 22 includes only a part of the channel well and the low-concentration drain region. Such modifications can be made easily by modifying the mask used for forming the low-concentration well.

It is needless to say that the conductivity type can be reversed in the structures of FIGS. 13A-13D.

Further, the present invention is by no means limited to the embodiments described heretofore, but various variations and modifications may be made without departing from the scope of the invention.

The present invention is based on Japanese priority application No. 2005-062427 filed on Mar. 7, 2005, which is incorporated herein as reference.

What is claimed is:

1. A semiconductor device comprising an LDMOS transistor, said LDMOS transistor comprising:
   a gate insulation film formed over a semiconductor substrate;
   a gate electrode formed over said gate insulation film;
   a drain well of a first conductivity type formed in said semiconductor substrate so as to include a gate region covered with said gate electrode;
   a channel well of a second conductivity type opposite to said first conductivity type formed in said drain well in a partially overlapped relationship with said gate region;
   a source region of said first conductivity type formed in said channel well in an overlapping manner or adjacent with a side surface of said gate electrode;
   a medium-concentration drain region of said first conductivity type having an intermediate concentration level and formed in said drain well at a side opposing to said source region in a manner partially overlapping with said gate region, said medium-concentration drain region being formed with separation from said channel well;
   a drain region of said first conductivity type formed in said medium-concentration drain region with a separation from said gate region;
   a low concentration well of said second conductivity type formed inside said drain well so as to include at least a part between said channel well and said medium-concentration drain region.

2. The semiconductor device as claimed in claim 1, wherein said medium-concentration drain region has an impurity concentration level lower than said channel well.

3. A semiconductor device as claimed in claim 1, wherein said semiconductor substrate comprises a p-type semiconductor substrate and said LDMOS transistor is an n-channel LDMOS transistor,
   wherein said semiconductor device includes an n-type isolation well and said semiconductor device further comprises a p-channel LDMOS transistor on said n-type isolation well,
   said p-channel LDMOS transistor comprising:
   a drain well of p-type, a channel well of n-type, a medium-concentration drain region of p-type, a source region of p-type, and a drain region of p-type,
   wherein said low concentration well of p-type constituting said n-channel LDMOS transistor is formed simultaneously with said second drain well of p-type constituting said p-channel LDMOS transistor.

4. A semiconductor device as claimed in claim 1, wherein said semiconductor substrate comprises a p-type semiconductor substrate and said LDMOS transistor is an n-channel LDMOS transistor,
   wherein said semiconductor device includes an n-type isolation well and said semiconductor device further comprises a p-channel LDMOS transistor on said n-type isolation well,
   said p-channel LDMOS transistor comprising:
   a drain well of p-type, a channel well of n-type, a medium-concentration drain region of p-type, a source region of p-type, and a drain region of p-type, wherein said drain well of n-type constituting said n-channel LDMOS transistor is formed simultaneously with said isolation well of n-type constituting said p-channel LDMOS transistor.

5. A semiconductor device as claimed in claim 1, wherein said semiconductor substrate comprises a p-type semiconductor substrate and said LDMOS transistor is an n-channel LDMOS transistor,
wherein said semiconductor device further comprises a conventional n-channel MOS transistor, said conventional n-channel MOS transistor comprising a p-type well,
wherein said low concentration well of p-type constituting said n-channel LDMOS transistor is formed simultaneously to said p-type well of said conventional n-channel MOS transistor.

6. The semiconductor device as claimed in claim 5, wherein said gate insulation film of said LDMOS transistor has a thickness smaller than said n-channel MOS transistor.

7. A semiconductor device as claimed in claim 1, wherein said semiconductor substrate comprises a p-type semiconductor substrate and said LDMOS transistor is an n-channel LDMOS transistor,
wherein said semiconductor device further comprises a conventional p-channel MOS transistor, said conventional p-channel MOS transistor comprising a n-type well,
wherein said drain well of n-type constituting said n-channel LDMOS transistor is formed simultaneously to said n-type well of said p-channel conventional MOS transistor.

8. A semiconductor device as claimed in claim 1, wherein said semiconductor substrate comprises an n-type semiconductor substrate and said LDMOS transistor is an n-channel LDMOS transistor,
wherein said semiconductor device includes a p-type isolation well and said semiconductor device further comprises a p-channel LDMOS transistor on said p-type isolation well,
said n-channel LDMOS transistor comprising:
a drain well of n-type, a channel well of p-type, a medium-concentration drain region of n-type, a source region of n-type, and a drain region of n-type,
wherein said low concentration well of n-type constituting said p-channel LDMOS transistor is formed simultaneously with said second drain well of n-type constituting said n-channel LDMOS transistor.

9. A semiconductor device as claimed in claim 1, wherein said semiconductor substrate comprises an n-type semiconductor substrate and said LDMOS transistor is a p-channel LDMOS transistor,
wherein said semiconductor device includes a p-type isolation well and said semiconductor device further comprises an n-channel LDMOS transistor on said p-type isolation well,
said n-channel LDMOS transistor comprising:
a drain well of n-type, a channel well of p-type, a medium-concentration drain region of n-type, a source region of n-type, and a drain region of n-type,
wherein said drain well of p-type constituting said p-channel LDMOS transistor is formed simultaneously with said isolation well of p-type constituting said n-channel LDMOS transistor.

10. A semiconductor device as claimed in claim 1, wherein said semiconductor substrate comprises an n-type semiconductor substrate and said LDMOS transistor is a p-channel LDMOS transistor,
wherein said semiconductor device further comprises a conventional p-channel MOS transistor, said conventional p-channel MOS transistor comprising an n-type well,
wherein said low concentration well of n-type constituting said p-channel LDMOS transistor is formed simultaneously to said n-type well of said conventional p-channel MOS transistor.

11. A semiconductor device as claimed in claim 1, wherein said semiconductor substrate comprises a n-type semiconductor substrate and said LDMOS transistor is an p-channel LDMOS transistor,
wherein said semiconductor device further comprises a conventional n-channel MOS transistor, said conventional n-channel MOS transistor comprising a p-type well,
wherein said drain well of p-type constituting said p-channel LDMOS transistor is formed simultaneously to said p-type well of said n-channel conventional MOS transistor.

12. The semiconductor device as claimed in claim 1, wherein said gate insulation film has a uniform film thickness.

13. The semiconductor device as claimed in claim 1, wherein an edge of said gate electrode close to said drain region is formed on an insulation film having a thickness larger than a thickness of said gate insulation film.

14. A power supply unit, having a feedback circuit that controls an output voltage by comparing with a reference voltage,
said feedback circuit comprising an LDMOS transistor, comprising:
a gate insulation film formed over a semiconductor substrate;
a gate electrode formed over said gate insulation film;
a drain well of a first conductivity type formed in said substrate so as to include gate region covered by said gate electrode;
a channel well of a second conductivity type opposite to said first conductivity type formed in said drain well in partially overlapped relationship with said gate region;
a source region of said first conductivity type formed in said channel well in an overlapping manner or adjacent with a side surface of said gate electrode;
a medium-concentration drain region of said first conductivity type having an intermediate concentration and formed in said drain well at a side opposing to said source in a manner partially overlapping with said gate region, said medium-concentration drain region being formed with separation from said channel well;
a drain region of said first conductivity type formed in said medium-concentration drain region with a separation from said gate region;
a low concentration well of said second conductivity type formed inside said drain well so as to include at least a part between said channel well and said medium-concentration drain region.

15. A DC/DC converter having a charge pump circuit, said charge pump circuit comprising integrated switching devices causing charging and discharging in a capacitor, at least one of said integrated switching devices comprising an LDMOS transistor, comprising:
a gate insulation film formed over a semiconductor substrate;
a gate electrode formed over said gate insulation film;

a drain well of a first conductivity type formed in said substrate so as to include a gate region covered by said gate electrode;

a channel well of a second conductivity type opposite to said first conductivity type formed in said drain well in partially overlapped relationship with said gate region;

a source region of said first conductivity type formed in said channel well in an overlapping manner or adjacent with a side surface of said gate electrode;

a medium-concentration drain region of said first conductivity type having an intermediate concentration and formed in said drain well at a side opposing to said source in a manner partially overlapping with said gate region, said medium-concentration drain region being formed with separation from said channel well;

a drain region of said first conductivity type formed in said medium-concentration drain region with a separation from said gate region;

a low concentration well of said second conductivity type formed inside said drain well so as to include at least a part between said channel well and said medium-concentration drain region.

* * * * *